United States Patent
Salcedo et al.

(10) Patent No.: US 9,123,540 B2
(45) Date of Patent: Sep. 1, 2015

(54) APPARATUS FOR HIGH SPEED SIGNAL PROCESSING INTERFACE

(71) Applicant: Analog Devices, Inc., Norwood, MA (US)

(72) Inventors: Javier Alejandro Salcedo, North Billerica, MA (US); Srivatsan Parthasarathy, Acton, MA (US)

(73) Assignee: Analog Devices, Inc., Norwood, MA (US)

( * ) Notice: Subject to any disclaimer, the term of this patent is extended or adjusted under 35 U.S.C. 154(b) by 89 days.

(21) Appl. No.: 14/068,566

(22) Filed: Oct. 31, 2013

(65) Prior Publication Data

US 2015/0076557 A1    Mar. 19, 2015

Related U.S. Application Data

(60) Provisional application No. 61/877,761, filed on Sep. 13, 2013.

(51) Int. Cl.
H01L 29/72    (2006.01)
H01L 27/02    (2006.01)

(52) U.S. Cl.
CPC ................. H01L 27/0262 (2013.01)

(58) Field of Classification Search
CPC ............ H01L 27/0262; H01L 29/7436; H01L 2924/0002; H01L 2924/00; H01L 29/87
USPC ........... 257/173, 355, 360, E27.052, E27.079
See application file for complete search history.

(56) References Cited

U.S. PATENT DOCUMENTS

| 3,436,667 A | 4/1969 | Kedson |
|---|---|---|
| 4,633,283 A | 12/1986 | Avery |

(Continued)

FOREIGN PATENT DOCUMENTS

| DE | 10 2007 040 875 A1 | 3/2009 |
|---|---|---|
| EP | 0 168 678 A2 | 1/1986 |

(Continued)

OTHER PUBLICATIONS

Salcedo et al., *Bidirectional Devices for Automotive-Grade Electrostatic Discharge Applications*, IEEE Electron Device Letters, vol. 33, No. 6, Jun. 2012, 3 pages.

(Continued)

*Primary Examiner* — Andy Huynh
(74) *Attorney, Agent, or Firm* — Knobbe, Martens, Olson & Bear, LLP

(57) ABSTRACT

Signal IO protection devices referenced to a single supply are provided herein. In certain implementations, a protection device includes a first silicon controlled rectifier (SCR) and a first diode for providing protection between a signal node and a power supply network, such as a power low supply network or a power high supply network. The SCR and diode structures are integrated in a common circuit layout, such that certain wells and active regions are shared between structures. In other implementations, a protection device includes first and second SCRs for providing protection between the signal node and the power low supply network or between the signal node and the power high supply network, and the SCR structures are integrated in a common circuit layout. The protection devices are suitable for single cell data conversion interface protection to a single supply in sub 3V operation.

29 Claims, 21 Drawing Sheets

(56) References Cited

U.S. PATENT DOCUMENTS

| | | |
|---|---|---|
| 5,061,652 A | 10/1991 | Bendernagel et al. |
| 5,276,582 A | 1/1994 | Merrill et al. |
| 5,341,005 A | 8/1994 | Canclini |
| 5,343,053 A | 8/1994 | Avery |
| 5,541,801 A | 7/1996 | Lee et al. |
| 5,576,557 A | 11/1996 | Ker et al. |
| 5,615,074 A | 3/1997 | Avery |
| 5,652,689 A | 7/1997 | Yuan |
| 5,663,860 A | 9/1997 | Swonger |
| 5,742,084 A | 4/1998 | Yu |
| 5,745,323 A | 4/1998 | English et al. |
| 5,781,389 A | 7/1998 | Fukuzako et al. |
| 5,786,617 A | 7/1998 | Merrill et al. |
| 5,889,644 A | 3/1999 | Schoenfeld et al. |
| 5,895,840 A | 4/1999 | Ohuchi et al. |
| 5,895,940 A | 4/1999 | Kim |
| 5,998,813 A | 12/1999 | Bernier |
| 6,097,068 A | 8/2000 | Brown et al. |
| 6,137,140 A | 10/2000 | Efland et al. |
| 6,144,542 A | 11/2000 | Ker et al. |
| 6,236,087 B1 | 5/2001 | Daly et al. |
| 6,258,634 B1 | 7/2001 | Wang et al. |
| 6,310,379 B1 | 10/2001 | Andresen et al. |
| 6,329,694 B1 | 12/2001 | Lee et al. |
| 6,403,992 B1 | 6/2002 | Wei |
| 6,404,261 B1 | 6/2002 | Grover et al. |
| 6,423,987 B1 | 7/2002 | Constapel et al. |
| 6,512,662 B1 | 1/2003 | Wang |
| 6,590,273 B2 | 7/2003 | Okawa et al. |
| 6,621,126 B2 | 9/2003 | Russ |
| 6,665,160 B2 | 12/2003 | Lin et al. |
| 6,667,870 B1 | 12/2003 | Segervall |
| 6,704,180 B2 | 3/2004 | Tyler et al. |
| 6,724,603 B2 | 4/2004 | Miller et al. |
| 6,756,834 B1 | 6/2004 | Tong et al. |
| 6,765,771 B2 | 7/2004 | Ker et al. |
| 6,768,616 B2 | 7/2004 | Mergens et al. |
| 6,784,489 B1 | 8/2004 | Menegoli |
| 6,870,202 B2 | 3/2005 | Oka |
| 6,960,792 B1 | 11/2005 | Nguyen |
| 6,960,811 B2 | 11/2005 | Wu et al. |
| 6,979,869 B2 | 12/2005 | Chen et al. |
| 7,034,363 B2 | 4/2006 | Chen |
| 7,038,280 B2 | 5/2006 | Righter |
| 7,071,528 B2 | 7/2006 | Ker et al. |
| 7,125,760 B1 | 10/2006 | Reese et al. |
| 7,232,705 B2 | 6/2007 | Righter |
| 7,232,711 B2 | 6/2007 | Gambino et al. |
| 7,335,543 B2 | 2/2008 | Chen et al. |
| 7,345,341 B2 | 3/2008 | Lin et al. |
| 7,385,793 B1 | 6/2008 | Ansel et al. |
| 7,436,640 B2 | 10/2008 | Su et al. |
| 7,566,914 B2 | 7/2009 | Salcedo et al. |
| 7,570,467 B2 | 8/2009 | Watanabe et al. |
| 7,601,991 B2 | 10/2009 | Salcedo et al. |
| 7,663,190 B2 | 2/2010 | Vinson |
| 7,714,357 B2 | 5/2010 | Hayashi et al. |
| 7,834,378 B2 | 11/2010 | Ryu et al. |
| 7,910,999 B2 | 3/2011 | Lee et al. |
| 7,969,006 B2 | 6/2011 | Lin et al. |
| 8,044,457 B2 | 10/2011 | Salcedo et al. |
| 8,198,651 B2 | 6/2012 | Langguth et al. |
| 8,217,461 B1 | 7/2012 | Chu et al. |
| 8,222,698 B2 | 7/2012 | Salcedo et al. |
| 8,331,069 B2 | 12/2012 | Galy et al. |
| 8,368,116 B2 | 2/2013 | Salcedo et al. |
| 8,416,543 B2 | 4/2013 | Salcedo |
| 8,432,651 B2 | 4/2013 | Salcedo et al. |
| 8,466,489 B2 | 6/2013 | Salcedo et al. |
| 8,553,380 B2 | 10/2013 | Salcedo |
| 8,592,860 B2 | 11/2013 | Salcedo et al. |
| 8,610,251 B1 | 12/2013 | Salcedo |
| 8,633,509 B2 | 1/2014 | Salcedo |
| 8,637,899 B2 | 1/2014 | Salcedo |
| 8,665,571 B2 | 3/2014 | Salcedo et al. |
| 8,680,620 B2 | 3/2014 | Salcedo et al. |
| 8,772,091 B2 | 7/2014 | Salcedo et al. |
| 8,796,729 B2 | 8/2014 | Clarke et al. |
| 8,860,080 B2 | 10/2014 | Salcedo |
| 8,946,822 B2 | 2/2015 | Salcedo et al. |
| 8,947,841 B2 | 2/2015 | Salcedo et al. |
| 9,006,781 B2 | 4/2015 | Salcedo et al. |
| 9,006,782 B2 | 4/2015 | Salcedo |
| 2001/0040254 A1 | 11/2001 | Takiguchi |
| 2002/0021538 A1 | 2/2002 | Chen et al. |
| 2002/0081783 A1 | 6/2002 | Lee et al. |
| 2002/0109190 A1 | 8/2002 | Ker et al. |
| 2002/0122280 A1 | 9/2002 | Ker et al. |
| 2002/0153571 A1 | 10/2002 | Mergens et al. |
| 2002/0187601 A1 | 12/2002 | Lee et al. |
| 2003/0038298 A1 | 2/2003 | Cheng et al. |
| 2003/0076636 A1 | 4/2003 | Ker et al. |
| 2004/0135229 A1 | 7/2004 | Sasahara |
| 2004/0164354 A1 | 8/2004 | Mergens et al. |
| 2004/0190208 A1 | 9/2004 | Levit |
| 2004/0207021 A1 | 10/2004 | Russ et al. |
| 2004/0240128 A1 | 12/2004 | Boselli et al. |
| 2005/0012155 A1 | 1/2005 | Ker et al. |
| 2005/0082618 A1 | 4/2005 | Wu et al. |
| 2005/0087807 A1 | 4/2005 | Righter |
| 2005/0088794 A1 | 4/2005 | Boerstler et al. |
| 2005/0093069 A1 | 5/2005 | Logie |
| 2005/0133869 A1 | 6/2005 | Ker et al. |
| 2005/0151160 A1 | 7/2005 | Salcedo et al. |
| 2005/0173727 A1 | 8/2005 | Manna et al. |
| 2005/0195540 A1 | 9/2005 | Streibl et al. |
| 2006/0033163 A1 | 2/2006 | Chen |
| 2006/0109595 A1 | 5/2006 | Watanabe et al. |
| 2006/0145260 A1 | 7/2006 | Kim |
| 2006/0151836 A1 | 7/2006 | Salcedo et al. |
| 2006/0186467 A1 | 8/2006 | Pendharkar et al. |
| 2007/0007545 A1 | 1/2007 | Salcedo et al. |
| 2007/0058307 A1 | 3/2007 | Mergens et al. |
| 2007/0158748 A1 | 7/2007 | Chu et al. |
| 2008/0044955 A1 | 2/2008 | Salcedo et al. |
| 2008/0067601 A1 | 3/2008 | Chen |
| 2008/0203534 A1 | 8/2008 | Xu et al. |
| 2009/0032838 A1 | 2/2009 | Tseng et al. |
| 2009/0034137 A1 | 2/2009 | Disney et al. |
| 2009/0045457 A1 | 2/2009 | Bobde |
| 2009/0057715 A1 | 3/2009 | Ryu et al. |
| 2009/0206376 A1 | 8/2009 | Mita et al. |
| 2009/0230426 A1 | 9/2009 | Carpenter et al. |
| 2009/0236631 A1 | 9/2009 | Chen et al. |
| 2009/0309128 A1 | 12/2009 | Salcedo et al. |
| 2010/0133583 A1 | 6/2010 | Mawatari et al. |
| 2010/0163973 A1 | 7/2010 | Nakamura et al. |
| 2010/0327343 A1 | 12/2010 | Salcedo et al. |
| 2011/0101444 A1 | 5/2011 | Coyne et al. |
| 2011/0110004 A1 | 5/2011 | Maier |
| 2011/0176244 A1 | 7/2011 | Gendron et al. |
| 2011/0207409 A1 | 8/2011 | Ker et al. |
| 2011/0284922 A1 | 11/2011 | Salcedo et al. |
| 2011/0303947 A1 | 12/2011 | Salcedo et al. |
| 2011/0304944 A1 | 12/2011 | Salcedo et al. |
| 2012/0007207 A1 | 1/2012 | Salcedo |
| 2012/0008242 A1 | 1/2012 | Salcedo |
| 2012/0199874 A1 | 8/2012 | Salcedo et al. |
| 2012/0205714 A1 | 8/2012 | Salcedo et al. |
| 2012/0293904 A1 | 11/2012 | Salcedo et al. |
| 2013/0032882 A1 | 2/2013 | Salcedo et al. |
| 2013/0208385 A1 | 8/2013 | Salcedo et al. |
| 2013/0234209 A1 | 9/2013 | Parthasarathy et al. |
| 2013/0242448 A1 | 9/2013 | Salcedo et al. |
| 2013/0270605 A1 | 10/2013 | Salcedo et al. |
| 2013/0330884 A1 | 12/2013 | Salcedo et al. |
| 2014/0138735 A1 | 5/2014 | Clarke et al. |
| 2014/0167104 A1 | 6/2014 | Salcedo |
| 2014/0167105 A1 | 6/2014 | Salcedo et al. |
| 2014/0167106 A1 | 6/2014 | Salcedo |

(56) References Cited

U.S. PATENT DOCUMENTS

FOREIGN PATENT DOCUMENTS

| EP | 0 915 508 A1 | 5/1999 |
| EP | 1 703 560 A2 | 9/2006 |
| KR | 10-2006-0067100 | 2/2006 |
| KR | 10-2009-0123683 | 12/2009 |
| KR | 10-2010-0003569 | 1/2010 |

OTHER PUBLICATIONS

Anderson et al., *ESD Protection under Wire Bonding Pads*, EOS/ESD Symposium 99-88, pp. 2A.4.1-2A.4.7 (1999).

Luh et al. *A Zener-Diode-Activated ESD Protection Circuit for Sub-Micron CMOS Processes*, Circuits and Systems, IEEE International Symposium, May 28-31, 2000, Geneva, Switzerland, 4 pages.

Salcedo et al., *Electrostatic Discharge Protection Framework for Mixed-Signal High Voltage CMOS Applications*, IEEE Xplore, downloaded Feb. 23, 2010 at 12:53 EST, 4 pages.

Chang et al., *High-k Metal Gate-bounded Silicon Controlled Rectifier for ESD Protection*, 34th Electrical Overstress/Electrostatic Discharge Symposium, Sep. 2012, 7 pages.

Salcedo et al., *On-Chip Protection for Automotive Integrated Circuits Robustness*, 2012 8th International Caribbean Conference on Devices, Circuits and Systems (ICCDCS), 5 pages, Mar. 2012.

International Search Report and Written Opinion of the International Search Authority in PCT/US2013/03047, dated Jun. 27, 2013, 9 pages.

Extended European Search Report in Application No. 14167969.6-1552, dated Oct. 24, 2014, 10 pages, Reference: P11874lEP/SAB.

Petr Beták: "An Advanced SCR Protective Structure Against ESD Stress". Proceedings of the 13$^{th}$ Conference Student EEICT 2007, vol. 4, Jan. 1, 2007, pp. 286-290.

APPARATUS FOR HIGH SPEED SIGNAL PROCESSING INTERFACE

CROSS-REFERENCE TO RELATED APPLICATIONS

The present application claims priority to U.S. Provisional Patent Application No. 61/877,761, filed Sep. 13, 2013, titled "SIGNAL IO PROTECTION DEVICES REFERENCED TO SINGLE POWER SUPPLY AND METHODS OF FORMING THE SAME," the entirety of which is hereby incorporated herein by reference.

This application is related to U.S. application Ser. No. 14/068,869 entitled "DEVICES FOR MONOLITHIC DATA CONVERSION INTERFACE PROTECTION AND METHODS OF FORMING THE SAME", filed on Oct. 13, 2013, now U.S. Pat. No. 9,006,781, issued on Apr. 14, 2015, the disclosure of which is incorporated herein by reference in its entirety. This application is also related to application entitled "INTERFACE PROTECTION DEVICE WITH INTEGRATED SUPPLY CLAMP AND METHOD OF FORMING THE SAME," U.S. application Ser. No. 13/754,200, filed on Jan. 30, 2013, now U.S. Pat. No. 8,860,080, issued on Oct. 14, 2014,the disclosure of which is hereby incorporated by reference in its entirety herein.

BACKGROUND

1. Field

Embodiments of the invention relate to electronic systems, and more particularly, to signal input/output (IO) protection devices referenced to a single power supply.

2. Description of the Related Technology

Certain electronic systems can be exposed to a transient electrical event, or an electrical signal of a relatively short duration having rapidly changing voltage and high power. Transient electrical events can include, for example, electrical overstress (EOS) such as electrostatic discharge (ESD) events.

Transient electrical events can damage integrated circuits (ICs) inside an electronic system due to overvoltage conditions and/or high levels of power dissipation over relatively small areas of the ICs. High power dissipation can increase IC temperature, and can lead to numerous problems, such as thin gate oxide punch-through, shallow junction damage, narrow metal damage, and surface charge accumulation.

Moreover, relatively large scale System-on-a-Chip (SoC) for multi-Gigabits/second communication can integrate distributed and multi-level data conversion functionality on an integrated circuit. Such a system can use process technologies such as complementary-metal-oxide-semiconductor (CMOS) technologies that combine a large digital signal processing unit with high speed analog circuits utilizing supply voltages in the range of, for example, about 0.9 V to about 3 V. System interfaces are often required to have the capability of handling signals referenced to power low, for instance, ground GND, and that go beyond power high, for instance, a high supply voltage $V_{DD}$, or vice-versa. Under this constraint, the IO protection devices need to provide robust protection with reference to a single supply. Large-scale functionality SoC are particularly prone to fail during manufacturing due to complexity involved in implementing unconventional distributed on-chip protection against electrical overstress without degrading signal integrity. The damage can be caused by overstress such as charged-device-model (CDM) ESD stress conditions, affecting the yield and viability of the reliable system implementation.

There is a need to provide effective protection devices, including protection devices suitable for interface pins allowed to have reference to a single supply for relatively large scale System-on-a-Chip (SoC) applications.

SUMMARY

In one embodiment, an apparatus includes a substrate, a first n-type semiconductor region in the substrate, a first p-type semiconductor region in the substrate, a second n-type semiconductor region in the substrate, a second p-type semiconductor region in the substrate, a first p-type diffusion region in the first n-type semiconductor region, a first n-type diffusion region in the first p-type semiconductor region, a second n-type diffusion region in the second p-type semiconductor region, a deep n-type region, and at least one of a gate region or a resist protective oxide (RPO) region positioned between the first p-type diffusion region and the first n-type diffusion region. The deep n-type region is positioned beneath at least a portion of the first n-type semiconductor region, the first p-type semiconductor region, the second n-type semiconductor region, and the second p-type semiconductor region. The first n-type diffusion region is electrically connected to a first node, and the first p-type diffusion region and the second n-type diffusion region are electrically connected to a second node. The first p-type semiconductor region is positioned between the first and second n-type semiconductor regions, and the second n-type semiconductor region is positioned between the first and second p-type semiconductor regions. The first p-type diffusion region, the first n-type semiconductor region, the first p-type semiconductor region, and the first n-type diffusion region are configured to operate as a first silicon controlled rectifier (SCR) in a first electrical path between the second node and the first node.

In certain configurations, the apparatus further include a second p-type diffusion region in the first p-type semiconductor region, a third p-type diffusion region in the second p-type semiconductor region, and a third n-type semiconductor region in the substrate. The second p-type semiconductor region is positioned between the second and third n-type semiconductor regions, the deep n-type region is further positioned beneath at least a portion of the third n-type semiconductor region, the first node comprises a power low supply network, and the second node comprises a signal node. In some configurations, the third p-type diffusion region is electrically connected to the power low supply network, and the second n-type diffusion region and the second p-type semiconductor region are configured to operate as a diode in a second electrical path between the power low supply network and the signal node. In other configurations, the apparatus further includes a fourth p-type diffusion region in the second n-type semiconductor region and electrically connected to the power low supply network, and the fourth p-type diffusion region, the second n-type semiconductor region, the second p-type semiconductor region, and the second n-type diffusion region are configured to operate as a second SCR in a second electrical path between the power low supply network and the signal node.

In another embodiment, an apparatus includes a substrate, a first semiconductor region of a first doping type in the substrate, a second semiconductor region of a second doping type in the substrate, a third semiconductor region of the first doping type in the substrate, a fourth semiconductor region of the second doping type in the substrate, a first diffusion region of the second type in the first semiconductor region, a second diffusion region of the first type in the second semiconductor region, a third diffusion region of the first type in the fourth semiconductor region, a deep region of the first type, and at least one of a gate region or an RPO region positioned between the first and second diffusion regions. The second semiconductor region is positioned between the first and third semiconductor regions, and the third semiconductor region is positioned between the second and fourth semiconductor regions. The second diffusion region is electrically connected to a first node, and the first and third diffusion regions are electrically connected to a second node. The deep region is positioned beneath at least a portion of the first semiconductor region, the second semiconductor region, the third semiconductor region, and the fourth semiconductor region. The first diffusion region, the first well region, the second well region, and the second diffusion region are configured to operate as an SCR.

In another embodiment, a method of manufacturing a protection device is provided. The method includes forming a deep n-type region in a substrate, forming a first n-type semiconductor region in the substrate, forming a first p-type semiconductor region in the substrate, forming a second n-type semiconductor region in the substrate, and forming a second p-type semiconductor region in the substrate. The first p-type semiconductor region is positioned between the first and second n-type semiconductor regions, the second n-type semiconductor region is positioned between the first and second p-type semiconductor regions, and the deep n-type region is positioned beneath at least a portion of the first n-type semiconductor region, the first p-type semiconductor region, the second n-type semiconductor region, and the second p-type semiconductor region. The method further includes forming a first p-type diffusion region in the first n-type semiconductor region, forming a first n-type diffusion region in the first p-type semiconductor region, electrically connecting the first n-type diffusion region to a first node, forming a second n-type diffusion region in the second p-type semiconductor region, electrically connected the first p-type diffusion region and the second n-type diffusion region to a second node, and forming at least one of a gate region or an RPO region between the first p-type diffusion region and the first n-type diffusion region.

DETAILED DESCRIPTION OF EMBODIMENTS

Figure 1A:
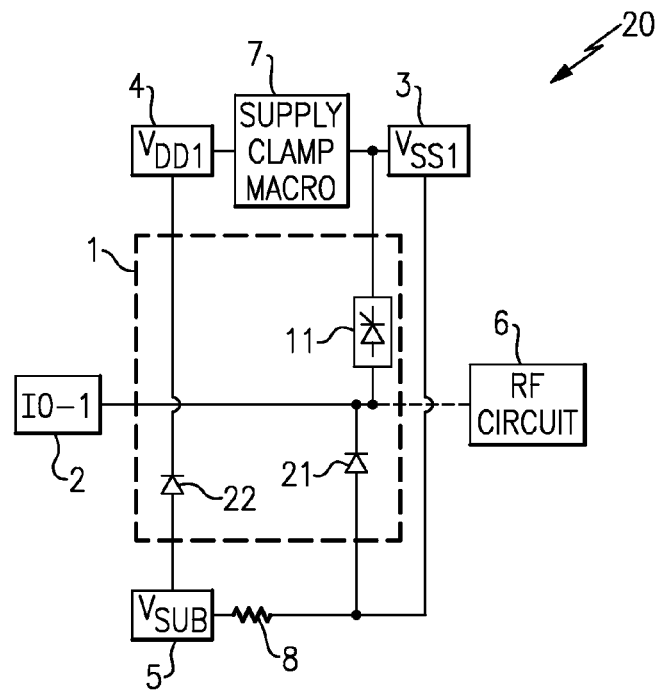
FIG. 1A is a schematic block diagram of one embodiment of a radio frequency (RF) integrated circuit including an interface and a signal IO protection device referenced to a single power supply.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Indeed, the higher dopant concentration regions of semiconductor devices are known as diffusion regions because the dopants tend to at least be partially defined by diffusion and thus by their very nature do not have sharp boundaries. Some boundaries as shown in the accompanying figures are of this type and are illustrated as abrupt structures merely for the assistance of the reader. In the embodiments described below, p-type regions can include a semiconductor material with a p-type dopant, such as boron. Further, n-type regions can include a semiconductor material with an n-type dopant, such as phosphorous. Further, gate dielectric can include insulators, such as high k-dielectric. Further, gates can include conductive regions with variable work functions, such as variable work-function metal or polysilicon. A skilled artisan will appreciate various concentrations of dopants, conductive materials and insulating material can be used in regions described below.

Overview of Single Power Reference Electrostatic Discharge (ESD) Protection Devices for High-Speed Interfaces To help assure that an electronic system is reliable, manufacturers can test the electronic system under defined stress conditions, which can be described by standards set by various organizations, such as the Joint Electronic Device Engineering Council (JEDEC), the International Electrotechnical Commission (IEC), and the International Organization for Standardization (ISO). The standards can cover a wide multitude of transient electrical events as discussed above, including electrostatic discharge (ESD) events.

Electronic circuit reliability is enhanced by providing protection devices to the certain nodes of an IC, such as the IC's pins or pads. The protection devices can maintain the voltage level at the nodes within a predefined safe range by transitioning from a high-impedance state to a low-impedance state when the voltage of the transient signal reaches a trigger voltage. Thereafter, the protection device can shunt at least a portion of the current associated with the transient signal to prevent the voltage of the transient signal from reaching a positive or negative failure voltage that is one of the most common causes of IC damage.

Apparatus and methods for single power reference ESD protection are provided herein. In certain implementations, a protection device includes a silicon controlled rectifier (SCR) for providing protection against a positive polarity ESD event that increases the voltage of a signal node relative to a power low supply voltage and a diode for providing protection against a negative polarity ESD event that decreases the voltage of the signal node relative to the power low supply voltage. The SCR can provide a high blocking voltage to prevent unintended activation during normal signaling conditions, and the diode can have a relatively low blocking voltage to protect circuitry against damage associated with the voltage of the signal node decreasing below the power low supply voltage.

In other implementations, a protection device includes a first SCR for providing protecting against a positive polarity ESD event received between the signal node and the power low supply and a second SCR for providing protection against a negative polarity ESD event receive between the signal node and the power low supply. The protection device can be used to provide both high forward and high reverse blocking voltages, and can be used, for example, in configurations in which the voltage of the signal node operates below the voltage of the power low supply during normal operation.

The protection devices described herein can be implemented using relatively compact circuit layouts. For example, structures providing forward and reverse protection between a signal node and a power low supply can be integrated in a common circuit layout, and can share wells, active regions, or other structures. In one embodiment, the protection device provides in-situ input/output interface protection using a single cell. The protection devices can aid in providing an integrated protection solution for ICs fabricated using a variety of processes, including, for example, sub-28-nm high-k metal-gate CMOS processes.

In certain implementations, a protection device is integrated as part of a circuit interface and synthesized with input/output (TO) circuit components for distributed wafer-level package and in-situ ESD protection. Such protection devices can be used, for example, to provide protection to high frequency signal nodes in system-on-a-chip (SoC) configurations. For example, the protection devices herein can provide protection to circuits such as receivers that operate at radio frequencies. In certain configurations, the protection devices can be used to protect high speed data rate converters, such as multi-gigabit/second analog-to-digital and/or digital-to-analog converters. For instance, in one implementation, the protection device can provide protection for clock signal nodes operating at up to about 10 GHz and/or to provide protection for analog-to-digital converter inputs operating between about 2 GHz and about 5 GHz.

In certain configurations, the protection devices can provide protection to circuits of a voltage domain of less than or equal to about 3 V, for instance, 0.9 V. The protection device can have relatively constant input/output (IO) capacitance. For example, in one implementation, a protection device has an IO capacitance in the range of about 50 femtofarads (fF) to about 400 fF, thereby reducing the impacts of signal distortion associated with capacitive mismatch and/or parasitic capacitive loading. Additionally, in certain implementations, by reducing device width the device's capacitance can be proportionally reduced in value down to about 30 fF, thereby achieving a value suitable for use in certain analog-to-digital (ADC) applications having lower capacitance specifications and a smaller stress current handling capability.

In certain configurations, the protection devices can have relatively low standing leakage, such as a leakage of less than about 10 nanoamperes (nA) at 125 degrees Celsius (C). The protection devices can also have relatively fast activation, such as a turn-on or activation time of less than about 100 picoseconds (ps). The protection devices can include complementary protection structures embedded in the protection device's integrated layout to provide on-chip protection against different ESD stress modes.

FIG. 1A is a schematic block diagram of one embodiment of a radio frequency (RF) integrated circuit 20. The integrated circuit or IC 20 includes a protection circuit 1, a signal node 2 (IO-1), a power low supply node 3 ($V_{SS1}$), a power high supply node 4 ($V_{DD1}$), a substrate supply node 5 ($V_{SUB}$), a radio frequency circuit 6, a supply clamp macro circuit 7, and a resistor 8.

In certain implementations, the signal node 2, the power low supply node 3, the power high supply node 4, and/or the substrate supply node 5 can correspond to bond pads of an integrated circuit (IC). However, other configurations are possible, such as implementations in which the IC uses bumps to provide electrical connectivity external to the IC. For example, the teachings herein are applicable to ball grid array (BGA) chip-scale package (CSP) configurations. Other forms of contacts are also applicable, such as pins and leads.

In one embodiment, the nodes are fabricated using metal stacks optimized to minimize capacitance. For instance, the signal node 2 can be via/plug connected up to a sixth metal interconnect layer (metal layer 6, not shown) at the device level, while the power low supply node 3 and the power high supply node 4 can be defined at the device level up to a third metal interconnect layer (metal layer 3, not shown), thereby keeping three levels of metal interconnect layers in between the signal and power reference. From the device metallization definition, a well characterized via/plug/metal stack for about optimum current handling capability and low capacitance can be subsequently used to connect to the top metal interconnect layer, from which the different signals can be redistributed by using a redistribution layer (RDL). In certain implementations, the RDL can correspond to a top-most metal layer added used to connect the different system signals to the bumps with relatively small parasitic interaction.

The integrated circuit 20 illustrates one example of an integrated circuit that can include one or more of the protection devices described herein. However, the protection devices can be used in other integrated circuit configurations, including, for example, implementations of integrated circuits using more or fewer protection devices, signal nodes, and/or power high or power low supply nodes.

Although FIG. 1A illustrates the integrated circuit 20 as including one signal node, one power low supply node, and one power high supply node, the integrated circuit 20 can include additional signal nodes, power low supply nodes, and/or power high supply nodes. Additionally, although a single power supply domain is illustrated, the teachings herein are applicable to multiple power supply domain configurations.

In one embodiment, a voltage difference between the power high supply node 4 and the power low supply node 3 is less than or equal to about 0.9 V. However, other configurations are possible.

The signal node 2 can correspond to a wide variety of signaling nodes, such as input or receive nodes, clock signal nodes, output or transmit nodes, and/or input/output or bidirectional nodes. In one embodiment, the signal node 2 is a digital-to-analog converter (DAC) output, such as an NMOS DAC output referenced to a power low supply or a PMOS DAC output referenced to power high supply.

In certain configurations, a voltage used to bias the substrate can be coupled to one or more of the integrated circuit's power supply domains. For example, in the configuration shown in FIG. 1A, the resistor 8 has been electrically connected between the substrate supply node 5 and the power low supply node 3. However, other configurations are possible, such as implementations in which the substrate supply node 5 is connected in other ways or implementations in which the substrate supply node 5 is omitted in favor of biasing the substrate using the power low supply node 3.

The supply clamp macro circuit 7 can be used to protect the integrated circuit 20 against ESD events received between the power high supply node 4 and the power low supply node 3. For example, the supply clamp macro circuit 7 can be used to maintain the voltage between the power high supply node 4 and the power low supply node 3 within a defined safe range. The supply clamp macro circuit 7 can include, for example, SCR and/or diode structures arranged to provide a desired supply protection characteristic. In certain configurations, the supply clamp macro circuit 7 operates to provide protection to circuits associated with different signal nodes of the IC.

The protection circuit 1 includes a first SCR 11, a first diode 21, and a second diode 22. As shown in FIG. 1A, the first SCR 11 includes an anode electrically connected to the signal node 2 and a cathode electrically connected to the power low supply node 3. Additionally, the first diode 21 includes an anode electrically connected to the power low supply node 3 and a cathode electrically connected to the signal node 2.

The protection circuit 1 can be used to provide transient electrical event protection to the RF circuit 6 and/or other circuitry of the integrated circuit 20. For example, the protection circuit 1 can provide protection against positive and negative polarity ESD events received between the signal node 2 and the power low supply node 3.

For example, when a positive polarity ESD event causes the voltage of the signal node 2 to increase relative to the voltage of the power low supply node 3, the first SCR 11 can activate or turn on to provide protection. Additionally, when a negative polarity ESD event causes the voltage of the signal node 2 to decrease relative to the voltage of the power low supply node 3, the first diode 21 can turn on. However, during normal operating conditions on the signal node 2, the protection circuit 1 can remain turned off.

The first SCR 11 can be used to provide a high blocking voltage for forward or positive voltages received between the signal node 2 and the power low supply node 3. For example, in one embodiment, the first SCR 11 can have a trigger voltage in the range of about 2 V to about 6 V. The first diode 21 can have a relatively low blocking voltage for reverse or negative voltages received between the signal node 2 and the power low supply node 3. For example, in one embodiment, the first diode 21 can trigger at a forward diode voltage in the range of about 0.3 V to about 0.7 V. In certain implementations, the first SCR 11 has a relatively high breakdown voltage for reverse bias, such as a breakdown voltage greater than about 4 V.

In certain implementation, the protection circuit 1 can operate in conjunction with the supply clamp macro circuit 7 to provide protection against ESD events received between the power high supply node 4 and the signal node 2. For example, in certain configurations, when an ESD event increases the voltage of the power high supply node 4 relative to the voltage of the signal node 2, a protection path can be provided between the power high supply node 4 and the signal node 2 through the series combination of the supply clamp macro circuit 7 and the first diode 21. Additionally, when an ESD event decreases the voltage of power high supply node 4 relative to the voltage of the signal node 2, a protection path can be provided between the power high supply node 4 and the signal node 2 through the series combination of the first SCR 11 the supply clamp macro circuit 7 low conducting path.

Configuring the protection circuit 1 to operate in conjunction with the supply clamp macro circuit 7 to provide protection against ESD events received between the power high supply node 4 and the signal node 2 can be useful in a variety of configurations. For example, signal integrity and/or isolation and noise rejection constraints may not permit use of a separate protection circuit directly between the power high supply node 4 and the signal node 2.

As shown in FIG. 1A, the protection circuit 1 further includes the second diode 22, which includes an anode electrically connected to the substrate supply node 5 and a cathode electrically connected to the power high supply node 4. The second diode 22 can be used to increase the current handling capability of the supply clamp macro circuit 7 for negative polarity ESD events received between the power high supply node 4 and the power low supply node 3 and/or to provide protection to certain guard well or ring structures of the protection circuit 1. However, other configurations are possible.

As will be described in detail further below, the SCR and diode structures of the protection circuit 1 can share wells, diffusion regions, and/or other structures so as to reduce the protection circuit's area relative to a configuration using protection structures implemented in separate circuit layouts.

Figure 1B:
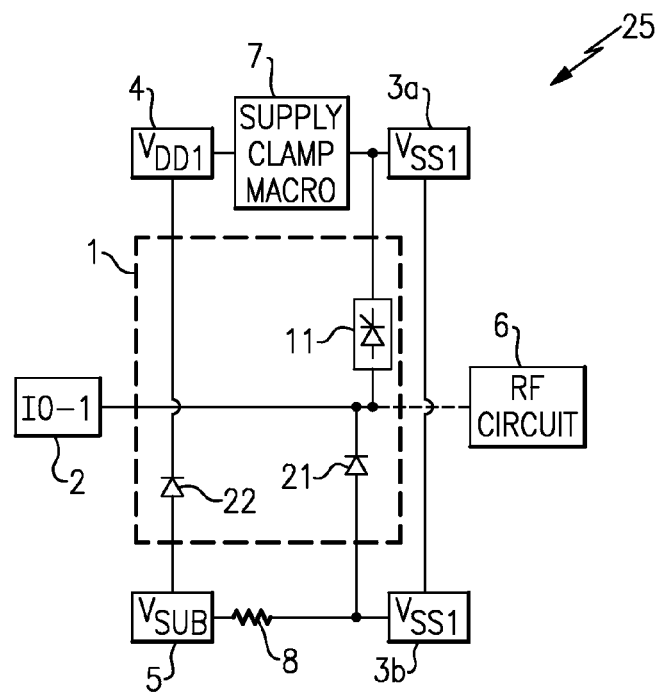
FIG. 1B is a schematic block diagram of another embodiment of an RF integrated circuit including an interface and a signal IO protection device referenced to two nodes of a single power supply.

FIG. 1B is a schematic block diagram of another embodiment of an integrated circuit 25.

The integrated circuit 25 of FIG. 1B is similar to the integrated circuit 20 of FIG. 1A, except that the integrated circuit 25 of FIG. 1B includes a first power low supply node 3a and a second power low supply node 3b, which can be connected to one another using metallization to form a power low supply network. Thus, in contrast to the configuration shown in FIG. 1A which includes one power low supply node in a power low supply network, the illustrated configuration includes two power low supply nodes in the power low supply network. The teachings herein are applicable to power low supply networks including one, two, or three or more power low supply nodes. As shown in FIG. 1B, the first SCR 11 is electrically connected between the signal node 2 and first power low supply node 3a, and the first diode 21 is electrically connected between the signal node 2 and the second power low supply node 3b.

In certain configurations, the first and second power low supply nodes 3a, 3b can correspond to separate power low supply bond pads and/or via stacks. In one embodiment, the first power low supply node 3a, the signal node 2, and the second power low supply node 3b corresponds to a ground-signal-ground (G-S-G) IC interface. Configuring an interface in this manner can aid in providing inductive return paths when the signal node 2 operates as high frequencies, such as radio frequencies. Additionally, the G-S-G configuration can also provide shielding to the signal node 2.

Figure 2A:
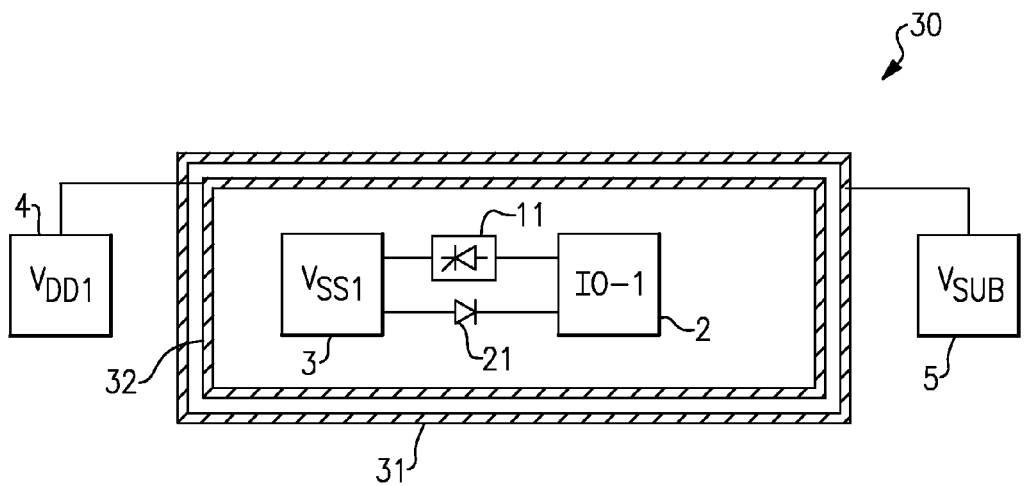
FIG. 2A is a top plan view of one embodiment of an integrated circuit interface layout including a signal IO protection device referenced to a single power supply.

FIG. 2A is a top plan view of an integrated circuit interface layout 30 according to one embodiment.

The interface layout 30 includes the power high supply node 4, the power low supply node 3, the signal node 2, and the substrate supply node 5, which have been positioned in a four-by-one array from left to right. The illustrated nodes can correspond to, for example, an arrangement of a portion of the IC's bond pads or to via stacks in ball grid array (BGA) chip-scale package (CSP) configurations.

As shown in FIG. 2A, the interface layout 30 has been annotated to include the first SCR 11 and the first diode 21, which can be used in to provide ESD protection between the power low supply node 3 and the signal node 2. Additionally, the interface layout 30 has been annotated to include a first metal ring 31, which surrounds a second metal ring 32, which in turn surrounds the power low supply node 3, the signal node 2, the first SCR 11, and the first diode 21. As illustrated in FIG. 2A, the first metal ring 31 is electrically connected to the substrate supply node 5 and the second metal ring 32 is electrically connected to the power high supply node 4. In certain configurations, the first metal ring 31 can be electrically connected to a P+ guard ring structure, and the second metal ring 32 can be electrically connected to an N+ guard ring structure. For example, in a configuration using a p-type substrate, the P+ guard ring can operate to collect majority carriers and the N+ guard ring can operate to collector minority carriers, thereby enhancing the isolation of the protection device to the substrate and mitigating the risk of latch-up.

The interface layout 30 illustrates one example of an interface layout for the integrated circuit 20 of FIG. 1A. However, other configurations are possible.

Figure 2B:
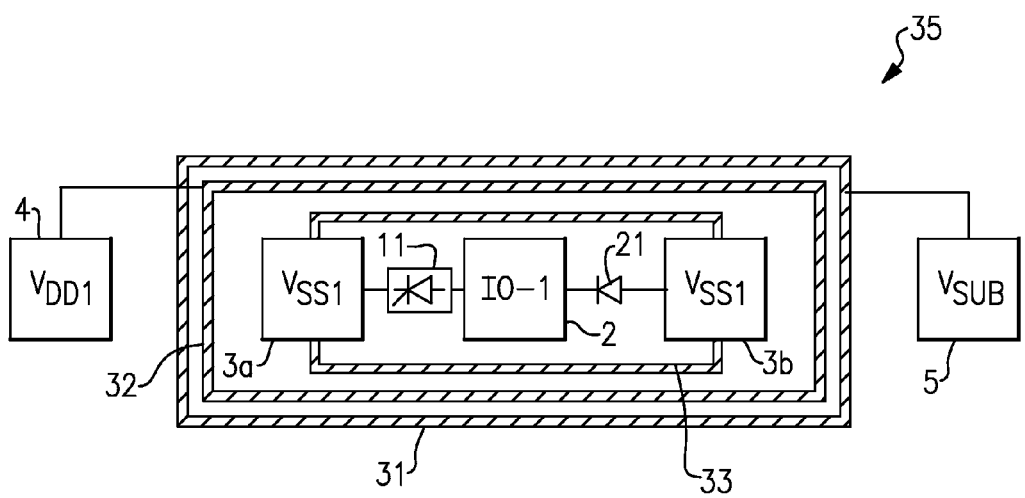
FIG. 2B is a top plan view of one embodiment of an integrated circuit interface layout including a signal IO protection device referenced to two nodes of a single power supply.

FIG. 2B is a top plan view of an integrated circuit interface layout 35 according to another embodiment.

The interface layout 35 of FIG. 2B is similar to the interface layout 30 of FIG. 2A, except that the interface layout 35 of FIG. 2B includes a first power low supply node 3a and a second power low supply node 3b. As shown in FIG. 2B, the power high supply node 4, the first power low supply node 3a, the signal node 2, the second power low supply node 3b, and the substrate supply node 5 have been arranged in a five-by-one array from left to right. Additionally, the first SCR 11 is electrically connected between the signal node 2 and the first power low supply node 3a, and the first diode 21 is electrically connected between the signal node 2 and the second power low supply node 3b. Furthermore, the interface layout 35 further includes a power low supply ring 33, which has been used to electrically connect the first and second power low supply nodes 3a, 3b to one another. The power low supply ring 33 can aid in reducing the resistance between the first and second power low supply nodes 3a, 3b, to enhance isolation of the signal node 2, and/or to provide inductive return paths.

The interface layout 35 illustrates one example of an interface layout for the integrated circuit 25 of FIG. 1B. However, other configurations are possible.

Various embodiments of protection devices will be described below. The protection devices can be used, for example, in the integrated circuits 20, 25 of FIGS. 1A-1B. However, the protection devices can be used in other configurations of integrated circuits.

Figure 3A:
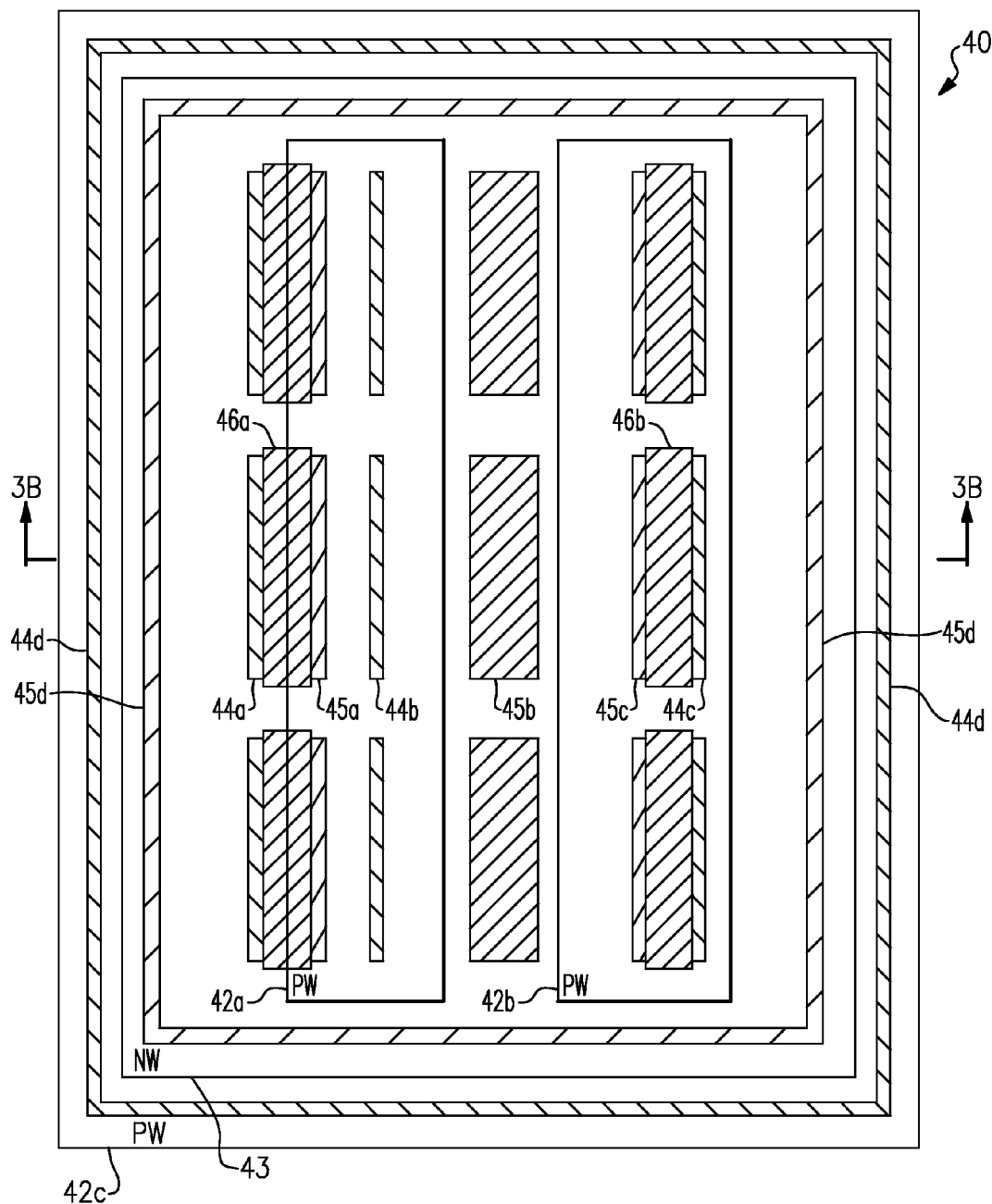
FIG. 3A is a top plan view of a vertically segmented signal IO protection device referenced to a single power supply according to one embodiment.
Figure 3B:
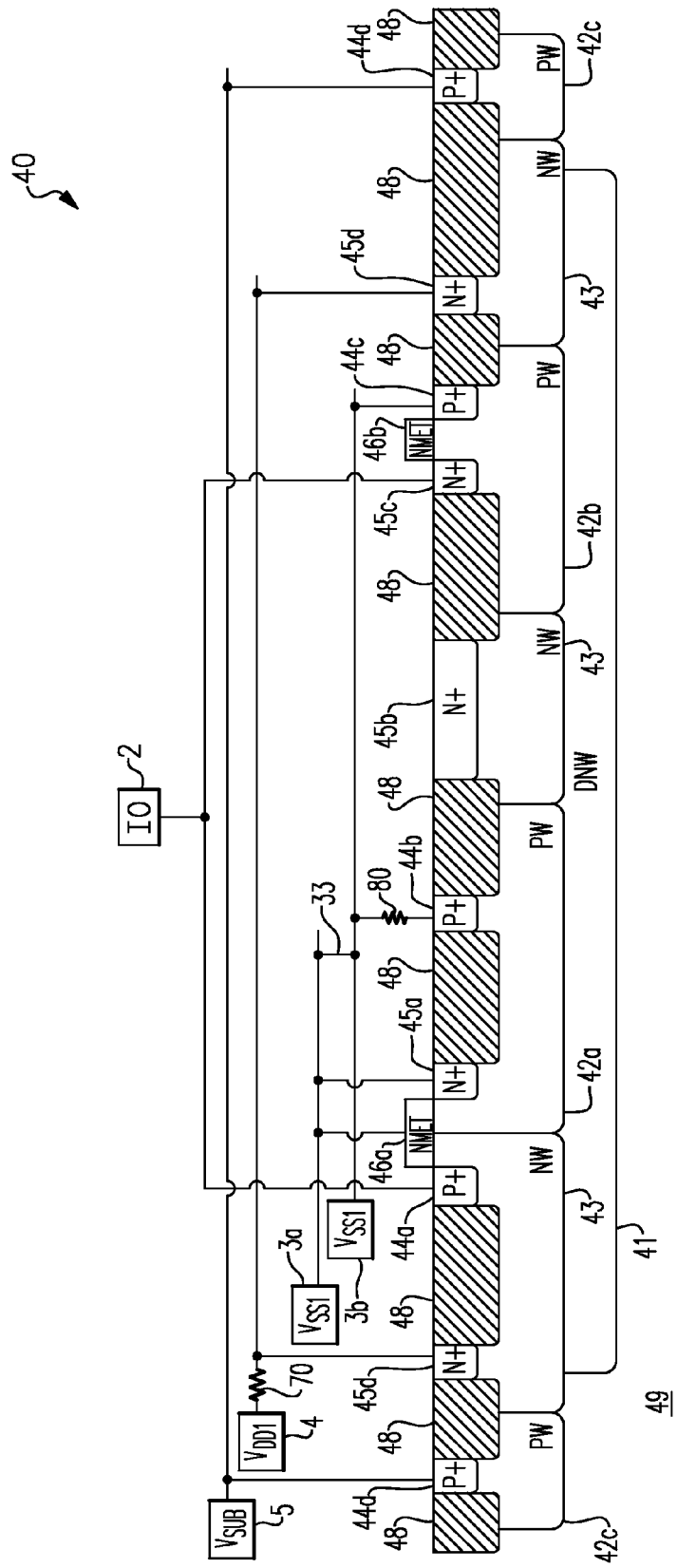
FIG. 3B is a cross section of the protection device of FIG. 3A taken along the lines 3B-3B, which has been annotated to illustrate one implementation of node connectivity.
Figure 3C:
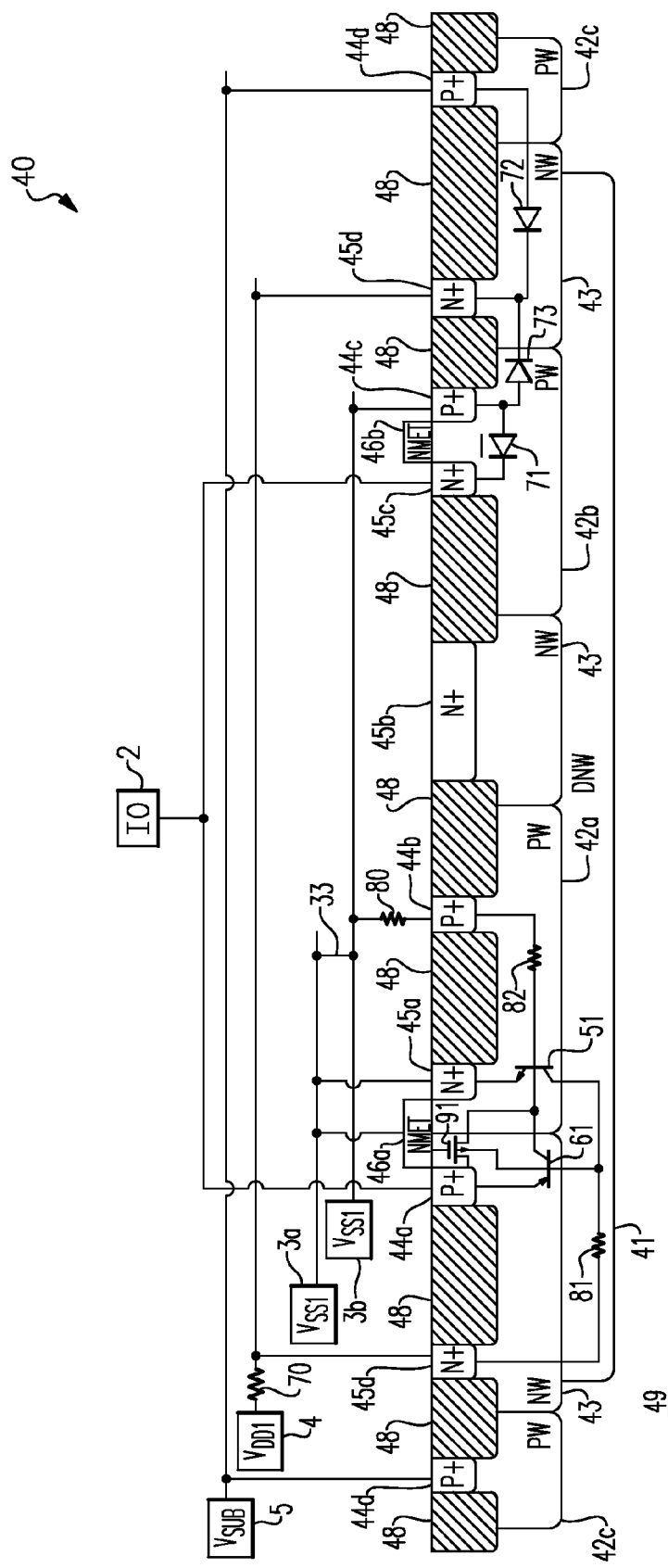
FIG. 3C is an annotated cross section of the protection device of FIG. 3A taken along the lines 3B-3B.

FIG. 3A is a top plan view of a vertically segmented signal IO protection device 40 according to one embodiment. FIG. 3B is a cross section of the protection device 40 of FIG. 3A taken along the lines 3B-3B. FIG. 3C is an annotated cross section of the protection device 40 of FIG. 3A taken along the lines 3B-3B.

The protection device 40 includes a deep n-well 41, a first p-well 42a, a second p-well 42b, a third p-well 42c, an n-well 43, first to fourth p-type diffusion or P+ regions 44a-44d, first to fourth n-type diffusion or N+ regions 45a-45d, first and second n-type metal (NMET) gate regions 46a, 46b, and oxide regions 48. For purposes of clarity, the deep n-well 41 and the oxide regions 48 have been omitted from the top plan view of FIG. 3A. The illustrated protection device 40 is fabricated in a p-type substrate 49. However, the teachings herein are applicable to other types of substrates. For example, the teachings herein are applicable to configurations using an n-type substrate in which the polarity of the illustrated active and well regions uses the opposite doping type.

As shown in FIG. 3A, the n-well 43 is disposed in the p-type substrate 49, and the first and second p-wells 42a, 42b are configured as adjacent islands in the n-well 43. Additionally, the third p-well 42c is configured to surround the n-well 43. The first P+ region 44a is disposed in a first or left region of the n-well 43. Additionally, the second N+ region 45b is disposed in a second or central region of the n-well 43. Furthermore, the fourth N+ region 45d is disposed in a third or right region of the n-well 43. Additionally, the first N+ region 45a and the second P+ region 44b are disposed in the first p-well 42a, with the second P+ region 44b positioned between the first N+ region 45a and the central region of the n-well 43. Furthermore, the third N+ region 45c and the third P+ region 44c are disposed in the second p-well 42b, with the third N+ region 45c positioned between the central region of the n-well 43 and the third P+ region 44c. Additionally, the fourth N+ region 45d has been configured as a ring that surrounds the first and second p-wells 42a, 42b, the first to third N+ regions 45a-45c, and the first to third P+ regions 44a-44c. Furthermore, the fourth P+ region 44d is disposed in the third p-well 42c, and has been configured as a ring that surrounds the n-well 43, the first to fourth N+ regions 45a-45d, and the first to third P+ regions 44a-44c. Additionally, the first NMET gate region 46a is positioned over a boundary between the first p-well 42a and the left region of the n-well 43, and extends between the first P+ region 44a and the first N+ region 45a. Furthermore, the second NMET gate region 46b is positioned over the second p-well 42b, and extends between the third N+ region 45c and the third P+ region 44c.

In certain processes, such as high-k metal gate CMOS processes, metals can be used to implement the gates of n-type metal oxide semiconductor (NMOS) and p-type metal oxide semiconductor (PMOS) transistors. Additionally, the composition and/or processing of the gate metal of PMOS transistors and the gate metal of NMOS transistors can be separately configured to achieve work functions corresponding to suitable threshold voltages for NMOS and PMOS transistors. As used herein, PMET gate regions can correspond to a gate metal structure associated with the process's PMOS transistors and NMET gate regions can correspond to a gate metal structure associated with the process's NMOS transistors.

In the illustrated configuration, the protection device 40 includes gates implemented using metals having different work functions. However, other configurations are possible, such as implementations in which the gates are made out of materials that are not metals, such as polysilicon. In certain implementations, the gate regions include a conductive structure and a dielectric structure such as silicon dioxide or a high-k dielectric, for example, in the range of 10 angstroms to 50 angstroms.

The illustrated protection device 40 includes the oxide regions 48. Formation of the oxide or isolation regions 48 can involve etching trenches in the p-type substrate 49, filling the trenches with a dielectric, such as silicon dioxide ($SiO_2$), and removing the excess dielectric using any suitable method, such as chemical-mechanical planarization. In certain implementations, the oxide regions 48 can be shallow trench regions disposed between certain active regions.

As shown in FIG. 3A, certain, wells, active regions, and gate regions extend in a first or vertical direction. Configuring the device in this manner can aid in controlling the flow of current during activation of the protection device 40 in a second or horizontal direction.

In certain configurations, the protection device 40 can be implemented using a plurality of sub-cells or building blocks that are connected together to operate as the protection device. For example, in the configuration of FIGS. 3A-3C, the protection device 40 has been implemented using three sub-cells replicated in the vertical direction, which can be connected to one another using interconnect layers and contacts. In some configurations, the sub-cells can also be arranged next to each other in the horizontal direction for facilitating metal connectivity in implementations in which horizontally-orientated cells align better with the IC die aspect ratio.

Implementing the protection device using sub-cells can aid in providing enhanced performance by providing a structure having enhanced manufacturing process control relative to a single cell configuration. For example, using multiple sub-cells can reduce part-to-part variation in the protection device associated with fine process features or misalignment within manufacturing constraints. Such variation can affect standing leakage, current handling capability, and/or breakdown characteristics. Using multiple sub-cells can reduce variation relative to a configuration using a single sub-cell, which can have a relatively large amount of manufacturing variation in certain processes. Although the protection device 40 has been illustrated as including three sub-cells, the protection device 40 can include more or fewer sub-cells.

In the illustrated configuration, the deep n-well 41 has been positioned beneath the n-well 43 and the first and second p-wells 42a, 42b, and can be used to electrically isolate the first and second p-wells 42a, 42b from the p-type substrate 49.

As shown in FIG. 3A, the fourth P+ region 44d and the fourth N+ region 45d can be implemented as rings that surround the N+ regions, P+ regions, and gate regions associated with each of the sub-cells. In certain implementations, the fourth P+ region 44d and the fourth N+ region 45d can be electrically connected to the first and second metal rings 31, 32, respectively, of FIG. 2B. The fourth P+ region 44d and the fourth N+ region 45d can operate as guard rings for reducing the injection of charge from the protection device 40 into the substrate 49.

In certain implementations herein, the left region of the n-well 43 can be referred to as a first semiconductor region of the protection device 40, the first p-well 42a can be referred to as a second semiconductor region of the protection device 40, the central region of the n-well 43 can be referred to as a third semiconductor region of the protection device 40, the second p-well 42b can be referred to as a fourth semiconductor region of the protection device 40, and the right region of the n-well 43 can be referred to as a fifth semiconductor region of the protection device 40. Although the protection device 40 illustrates a configuration in which the first to fifth semiconductor regions are implemented as wells, other configurations are possible. For example, in various embodiments described below with reference to FIGS. 14-15, one or more of the wells are omitted in favor of using native regions.

Although FIG. 3A illustrates one possible top or plan view of the protection device 40, other configurations are possible, such as configurations including more or fewer sub-cells and/or configurations including a different arrangements of wells, gates, and/or diffusions regions. For example, in one embodiment, the left, center, and right regions of the n-well 43 are implemented using multiple n-wells.

Furthermore, although FIGS. 3A-3C illustrate the n-well 43 and the third p-well 42c as abutting, in other configurations a separation or gap is provided between n-well 43 and the third p-well 42c. For example, an explicit spacing can be provided between the an edge of the n-well 43 and an edge of the third p-well 42c, or a native or NTN implant blocking region can be used to block well implants during fabrication, thereby providing a separation between the wells. Such a separation can be used to enhance latch-up immunity and increase the n-well (NW) to p-well (PW) isolation blocking voltage. In one embodiment, the n-well 43 and the third p-well 42c are separated by about 0.5 um to about 2 um, for instance 1 um.

With reference to FIGS. 3B-3C, the cross-sections of the protection device 40 have been annotated to schematically depict various electrical connections between the protection device 40 and the signal node 2, the power high supply node 4, the first power low supply node 3a, the second power low supply node 3b, and the substrate supply node 5. Although one implementation of electrical connections between the nodes and the device's active regions and gate structures has been schematically depicted in FIGS. 3B-3C, other configurations are possible. The illustrated electrical connections can be made, for example, using contact and metal layers, such as those associated with metallization or back-end processing.

In the illustrated configuration, the first P+ region 44a and the third N+ region 45c are electrically connected to the signal node 2. Additionally, the first N+ region 45a is electrically connected to the first power low supply node 3a and to the first NMET gate region 46a. Furthermore, the second and third P+ regions 44b, 44c are electrically connected to the second power low supply node 3b. Additionally, fourth N+ region 45d is electrically connected to the power high supply node 4, and the fourth P+ region 44d is electrically connected to the substrate supply node 5.

Although FIGS. 3B-3C illustrate a configuration using the first and second power low supply nodes 3a, 3b, the teachings herein are applicable to configurations using more or fewer power low supply nodes. One or more interconnected power low supply nodes can be referred to herein as a power low supply network.

In the illustrated configuration, the second NMET gate region 46b is electrically floating. The second NMET gate region 46b does not operate as a gate of a metal oxide semiconductor (MOS) transistor in the illustrated configuration, since areas of different doping polarities are on opposing sides of the gate region. However, the second NMET gate region 46b has been advantageously used as an implant blocking region to allow more uniform current conduction and faster response during transient stress conditions.

The first NMET gate region 46a can be associated with a MOS transistor structure, as will be described in detail further below.

The substrate supply node $V_{SUB}$ has been electrically connected to the fourth P+ region 44d. In one embodiment, the fourth P+ region 44d is Kelvin-connected to the first and/or second power low supply nodes 3a, 3b. For example, the fourth P+ region 44d can be connected such that a resistance between the fourth P+ region 44d and the substrate supply node 5 is greater than a resistance between the p-type substrate 49 and the first and second power low supply nodes 3a, 3b. Although the protection device 40 is illustrated as including the substrate supply node 5, the substrate supply node 5 can be omitted in favor of electrically connecting the fourth P+ region 44d to the first and/or second power low supply nodes 3a, 3b.

The protection device 40 of FIG. 3C has been annotated to show certain equivalent circuit devices formed from the illustrated structure, such as a first NPN bipolar transistor 51, a first PNP bipolar transistor 61, a first resistor 81, a second resistor 82, a first diode 71, a second diode 72, a third diode 73, and a PMOS transistor 91. The protection device 40 of FIG. 3C has also been illustrated to include a first resistor structure 70 and a second resistor structure 80, which can be explicit resistors. Although the protection device 40 is illustrated as including the first and second resistor structures 70, 80, one or both of the resistor structures can be omitted.

The first resistor structure 70 can be used to provide additional resistance between the n-well 43 and the power high supply node 4, which can aid in enhancing decoupling from power injection, reducing the risk of latch-up, and/or reducing standing leakage. For instance, the first resistor structure 70 can prevent unwanted signals from the power high supply node 4 from being injected into the signal node 2. The second resistor structure 80 can be used to provide additional resistance between the second P+ region 44b and the second power low supply node 3b, which can aid in controlling the blocking voltage of the SCR associated with the first NPN bipolar transistor 51 and the first PNP bipolar transistor 61. The first and second resistor structures 70, 80 can be implemented in any suitable manner, such as by using a resistive material having a geometry selected to achieve the desired resistance. In certain implementations, the first and/or second resistor structures 70, 80 can be implemented using n-type and/or p-type poly resistor structures integrated within the device formation footprint. In one embodiment, the first resistor structure 70 has a resistance selected to be in the range of about 100Ω to about 10 kΩ. In one embodiment, the second resistor structure 80 has a resistance selected to be in the range of about 50Ω to about 5 kΩ.

The first NPN bipolar transistor 51 includes an emitter associated with the first N+ region 45a, a base associated with the first p-well 42a, and a collector associated with the left region of the n-well 43. The first PNP bipolar transistor 61 includes an emitter associated with the first P+ region 44a, a base associated with the left region of the n-well 43, and a collector associated with the first p-well 42a.

The first diode 71 includes a cathode associated with the third N+ region 45c and an anode associated with the second p-well 42b. The second diode 72 includes an anode associated with the third p-well 42c, and a cathode associated with the n-well 43.

The first diode 71 includes a metal gate structure adjacent the diode's p-n junction interface. For example, in the illustrated configuration, an edge of the second NMET gate region 46b is positioned over a boundary between the third N+ region 45c and the second p-well 42b.

Such a diode can be referred to herein as a "gated diode," which can provide enhanced conductivity relative to certain conventional diode structures. For example, during an ESD event, forward-diode conduction can be closer to the surface of the gated diode relative to a conventional diode structure. Additionally, the anode and cathode regions of the gated diode can be formed closer to each other, thereby decreasing the diode's resistance and minimizing diode forward recovery. Using a gated diode can result in lower voltage overshot during stress conditions.

The first resistor 81 is associated with a resistance of the n-well 43 and deep n-well 41 between the fourth N+ region 45d and the base of the first PNP bipolar transistor 61. The second resistor 82 is associated with a resistance of the first p-well 42a between the second P+ region 44b and the base of the first NPN bipolar transistor 51.

The PMOS transistor 91 includes a source associated with the first P+ region 44a, a drain associated with the first p-well 42a, a gate associated with the first NMET gate region 46a, and a body associated with the left region of the n-well 43.

Figure 4:
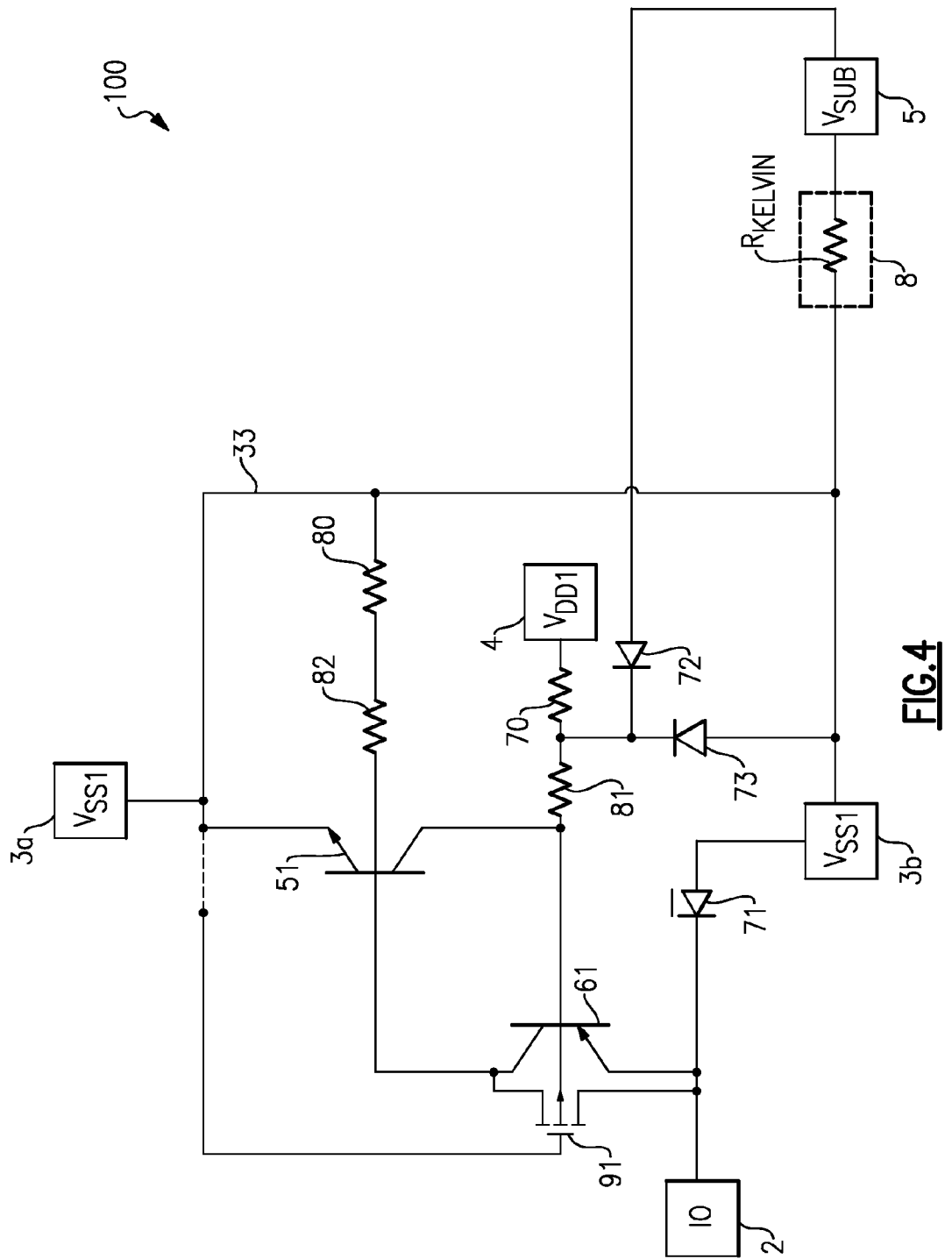
FIG. 4 is an equivalent circuit diagram of the protection device of FIGS. 3A-3C.

FIG. 4 is an equivalent circuit diagram 100 of the protection device of FIGS. 3A-3C. The circuit diagram 100 includes the first NPN bipolar transistor 51, the first PNP bipolar transistor 61, the diodes 71-73, the PMOS transistor 91, and the resistors 70, 80-82, which can be as described earlier. The circuit diagram 100 illustrates various connections between the components and the signal node 2, the first power low supply node 3a, the second power low supply node 3b, the power high supply node 4, and the substrate supply node 5.

The circuit diagram 100 illustrates one implementation of the first protection circuit 1 of FIGS. 1A-1B. For example, the first NPN bipolar transistor 51 and the first PNP bipolar transistor 61 can operate as the first SCR 11, and the first and second diodes 71, 72 of FIG. 4 can operate as the first and second diodes 21, 22, respectively, of FIGS. 1A-1B. Additional structures shown in FIGS. 1A-1B, such as the resistor 8, have been illustrated in FIG. 4.

During an ESD event that increases the voltage of the signal node 2 relative to the voltage of the power low supply node 3a, the PMOS transistor 91 can activate to provide enhanced protection and lower device on-state resistance of the protection device. The gate of the PMOS transistor 91 has been implemented using NMET, which can operate to increase the PMOS transistor's threshold voltage and to reduce leakage current relative to a configuration using PMET.

Figure 5:
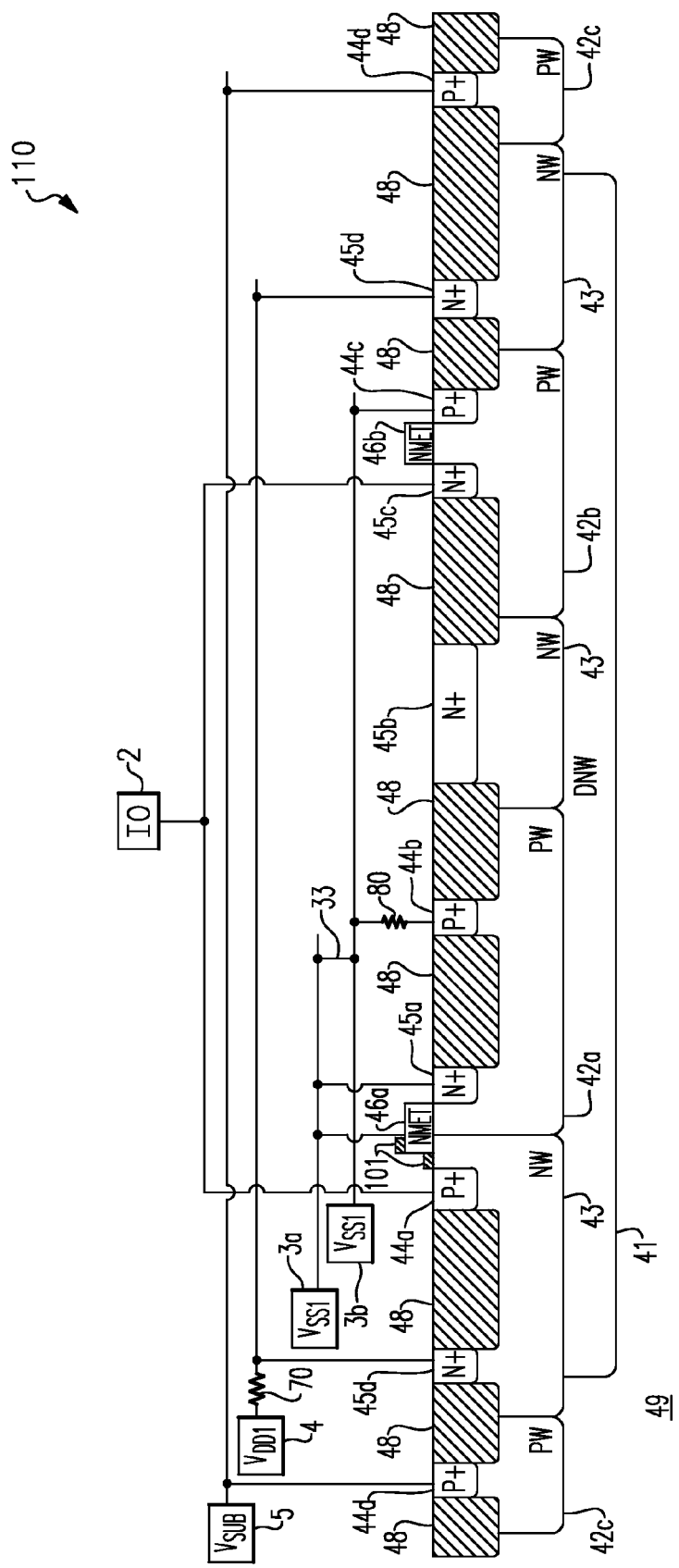
FIG. 5 is a cross section of one embodiment of a protection device with isolation from a common semiconductor substrate.

FIG. 5 is a cross section of a protection device 110 according to another embodiment.

The protection device 110 of FIG. 5 is similar to the protection device 40 of FIGS. 3A-3C, except that the protection device 110 of FIG. 5 further includes a resist protective oxide (RPO) region 101.

In the illustrated configuration, the RPO region 101 is disposed over a portion of the first NMET gate region 46a and over a surface of the left region of the n-well 43 between the first NMET gate region 46a and the first P+ region 44a. However, other RPO region configurations are possible.

The RPO region 101 can be used to prevent local formation of a silicide layer on a surface of the protection device 110 during processing. A silicide layer can have a relatively low resistance, and thus can have a high current density during an ESD event. In certain instances, blocking the silicide formation can further enhance high stress current handling capability, as high currents through the silicide layer and/or close to the semiconductor surface can lead to device damage, such as silicide melting associated with Joule heating and lower melting point of the silicide formation. Accordingly, using the RPO region 101 to prevent formation of a silicide layer (while silicide is formed on other contact regions) can increase the protection device's robustness during overstress by relatively increasing an amount of current that flows through the protection device's deeper semiconductor regions, such as the protection device's wells and diffusion regions, compared to the absence of the RPO region.

When the RPO region is omitted, the MOS-formation induces higher standing leakage current in favor of expediting the turn-on speed during stress.

In the illustrated configuration, a separation is provided between an edge of the NMET gate region 46a and an edge of the first P+ region 44a. However, other configurations are possible. For example, the NMET gate region 46a can be extended to eliminate the separation such that NMET gate region 46a and the first P+ region 44a abut. Abutting these two regions can expedite the turn-on of the device during high current stress by allowing a higher MOS-induced standing leakage.

Figure 6:
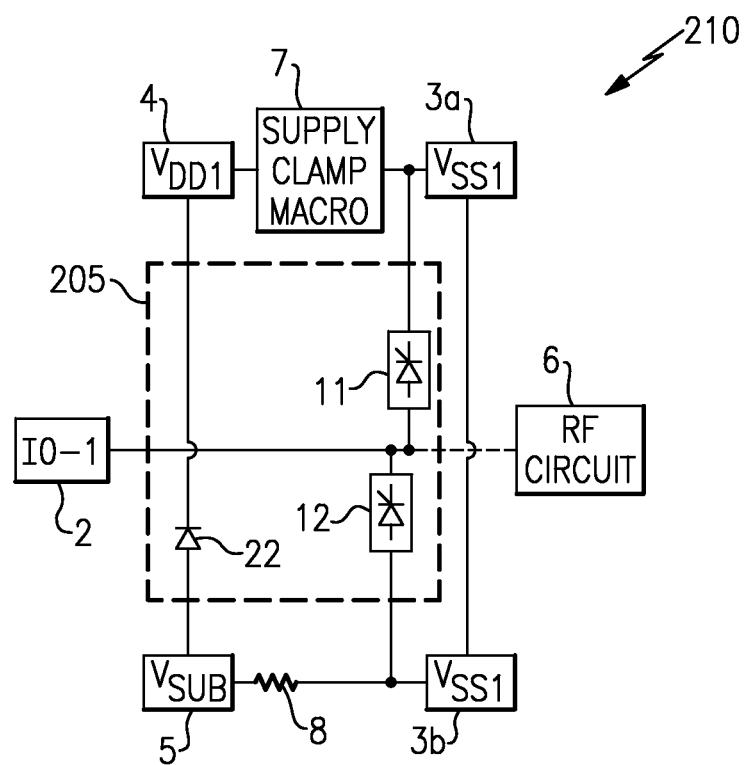
FIG. 6 is a schematic block diagram of another embodiment of an RF integrated circuit including an interface and a signal IO protection device referenced to two nodes of a single power supply.

FIG. 6 is a schematic block diagram of another embodiment of an integrated circuit 210.

The integrated circuit 210 of FIG. 6 is similar to the integrated circuit 25 of FIG. 1B, except that the integrated circuit 210 of FIG. 6 includes a different configuration of a protection circuit. In particular, the integrated circuit 210 of FIG. 6 includes a protection circuit 205, which includes a first SCR 11, a second SCR 12, and a diode 22. The integrated circuit 210 can be suitable for a variety of configurations, such as implementations in which the signal node 2 operates using DC coupled signals.

As shown in FIG. 6, the first SCR 11 includes an anode electrically connected to the signal node 2 and a cathode electrically connected to the first power low supply node 3a, and the second SCR 12 includes an anode electrically connected to the second power low supply node 3b and a cathode electrically connected to the signal node 2. The diode 22 is connected as described earlier with respect to FIGS. 1A-1B. Although FIG. 6 illustrates a power low supply network including two power low supply nodes, the teachings herein are applicable to power low supply network including more or fewer power low supply nodes.

The illustrated protection circuit 205 can be used to provide relatively high blocking voltages for both forward and reverse voltages between the signal node 2 and the power low supply. For example, in one embodiment, the first SCR 11 can have a trigger voltage in the range of about 2 V to about 6 V, for instance 3 V and the second SCR 12 can have a trigger voltage in the range of about −2 V to about −6 V, for instance −3V. The teachings herein are applicable to both symmetric forward and reverse blocking voltages and to asymmetric forward and reverse blocking voltages. In certain implementations, the first and second SCRs 11, 12 each have relatively high breakdown voltage for reverse bias, such as a breakdown voltage greater than about 4 V. Configuring the first and second SCRs 11, 12 in this manner aid the protection circuit 205 in providing voltage blocking for both forward and reverse voltages, thereby providing SCR action for both forward and reverse voltages.

Figure 7A:
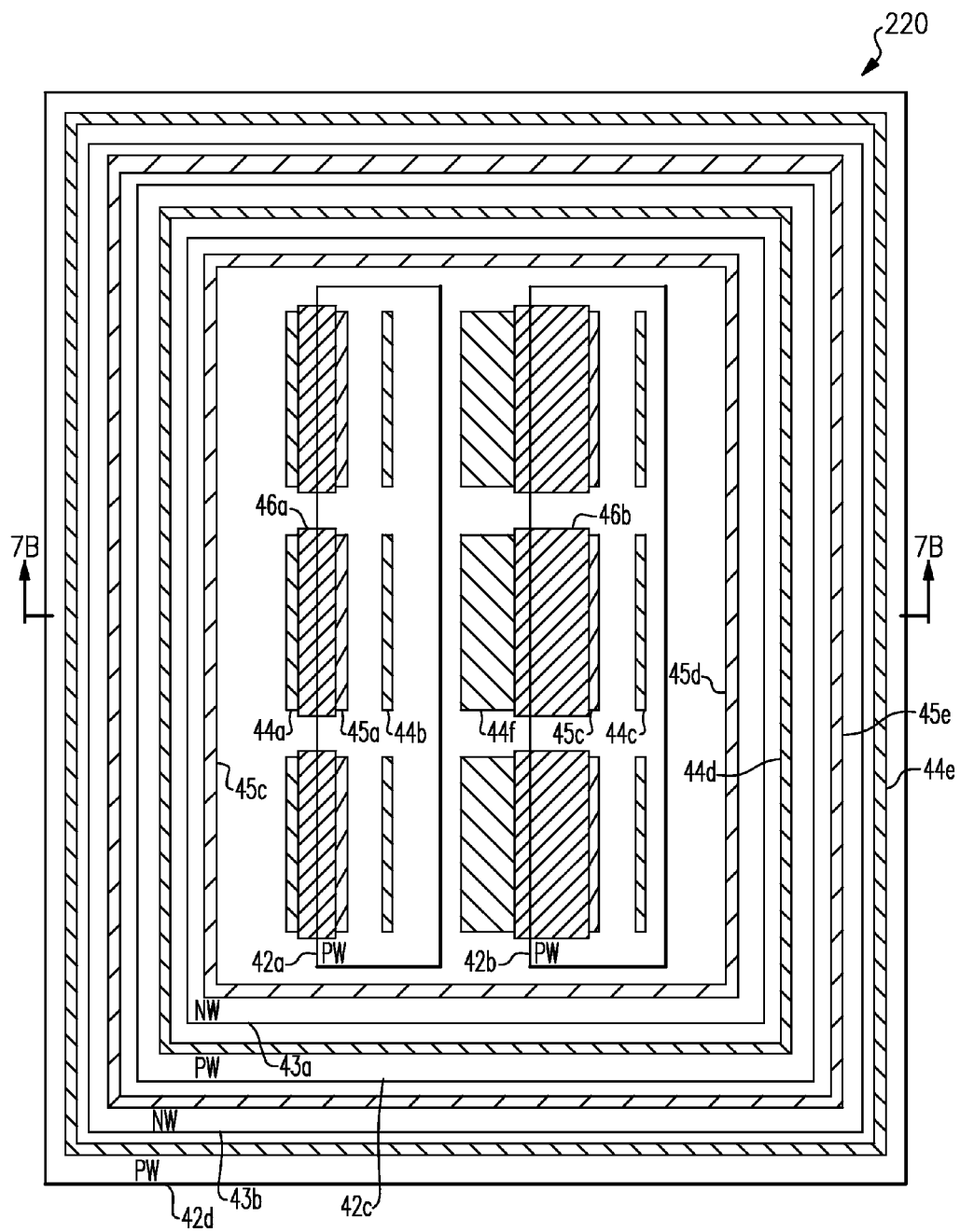
FIG. 7A is a top plan view of a signal IO protection device referenced to a single power supply according to one embodiment.
Figure 7B:
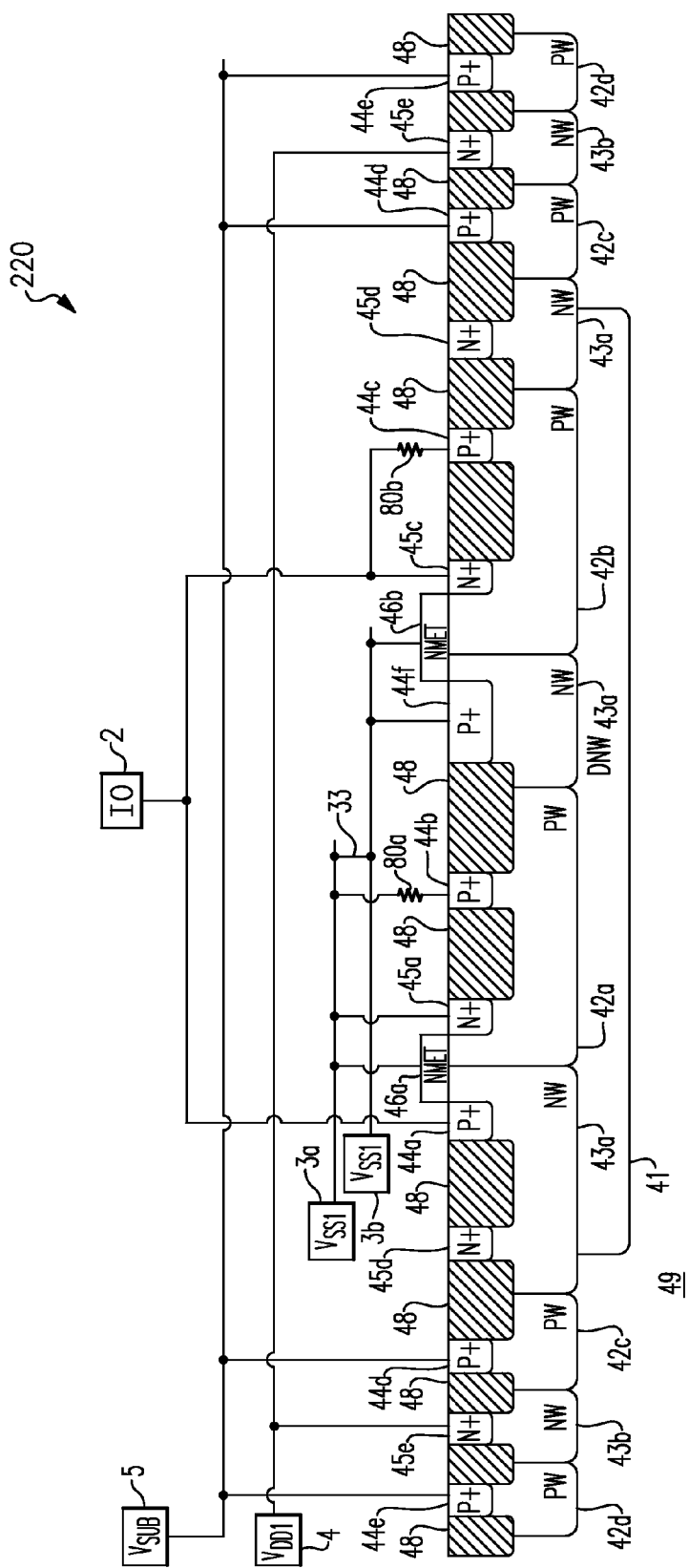
FIG. 7B is a cross section of the protection device of FIG. 7A taken along the lines 7B-7B, which has been annotated to illustrate one implementation of node connectivity.
Figure 7C:
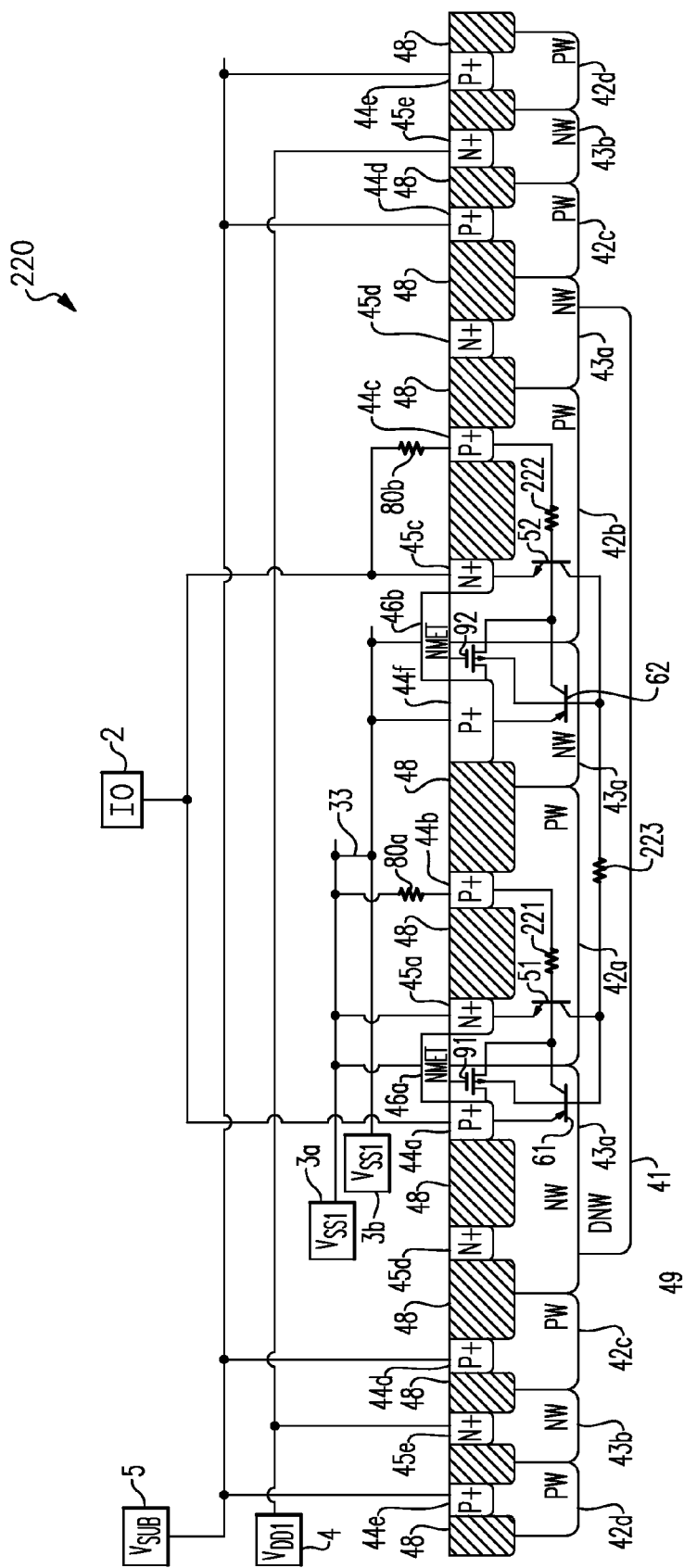
FIG. 7C is an annotated cross section of the protection device of FIG. 7A taken along the lines 7B-7B.

FIG. 7A is a top plan view of a protection device 220 according to one embodiment. FIG. 7B is a cross section of the protection device of FIG. 7A taken along the lines 7B-7B. FIG. 7C is an annotated cross section of the protection device of FIG. 7A taken along the lines 7B-7B.

The protection device 220 includes a deep n-well 41, first to fourth p-wells 42a-42d, first and second n-wells 43a, 43b, first to sixth P+ regions 44a-44f, the first N+ region 45a, third to fifth N+ regions 45c-45e, first and second NMET gate regions 46a, 46b, and oxide regions 48. For purposes of clarity, the deep n-well 41, the NMET gate regions 46a, 46b, and the oxide regions 48 have been omitted from the top plan view of FIG. 7A. The illustrated protection device 220 is fabricated in the p-type substrate 49.

Certain structures in the protection device 220 of FIGS. 7A-7C are similar to those of the protection device 40 of FIGS. 3A-3C. For example, the first n-well 43a and the first to third p-wells 42a-42c of FIGS. 7A-7C are implemented in a similar configuration as the n-well 43 and the first to third p-wells 42a-42c, respectively, of FIGS. 3A-3C. Additionally, the first to fourth P+ regions 44a-44d, the first N+ region 45a, the third and fourth N+ regions 45c, 45d, and the first NMET gate region 46a of FIGS. 7A-7C are implemented in a configuration similar to that shown in FIGS. 3A-3C. However, in contrast to the protection device 40 of FIGS. 3A-3C, the protection device 220 of FIGS. 7A-7C omits the second N+ region 45b in favor of including a sixth P+ region 44f in the central region of the first n-well 43a. Furthermore, in the illustrated configuration, the second NMET gate region 46b is positioned over a boundary between the central region of the first n-well 43a and the second p-well 42b, and extends between the sixth P+ region 44f and the third N+ region 45c. Additionally, the protection device 220 further includes a second n-well 43b surrounding the third p-well 42c, and a fourth p-well 42d surrounding the second n-well 43b. As shown in FIGS. 7A-7C, the protection device 220 includes the fifth N+ region 45e in the second n-well 43b, and the fifth P+ region 44e in the fourth p-well 42d.

In the illustrated configuration, the first P+ region 44a, the third N+ region 45c, and the third P+ region 44c are electrically connected to the signal node 2. Additionally, the first N+ region 45a, the second P+ region 44b, and the first NMET gate region 46a are electrically connected to the first power low supply node 3a. Furthermore, the sixth P+ region 44f and the second NMET gate region 46b are electrically connected to the second power low supply node 3b. Additionally, the fifth N+ region 45e is electrically connected to the power high supply node 4, and the fourth and fifth P+ regions 44d, 44e are electrically connected to the substrate supply node 5.

The protection device 220 includes a first SCR protection structure between the signal node 2 and first power low supply node 3a. However, in contrast to the protection device 40 of FIGS. 3A-3C which includes a diode protection structure between the second power low supply node 3b and the signal node 2, the protection device 220 of FIGS. 7A-7C has been implemented to include a second SCR protection structure between the second power low supply node 3b and the signal node 2. In particular, the sixth P+ region 44f, the central region of the first n-well 43a, the second p-well 42b, and the third N+ region 45c have been configured to operate as an SCR structure between the second power low supply node 3b and the signal node 2.

Accordingly, the illustrated configuration includes a first SCR for providing protecting against a positive polarity ESD event received between the signal node and the power low supply and a second SCR for providing protection against a negative polarity ESD event receive between the signal node and the power low supply.

To achieve high blocking voltage for both positive and negative polarity ESD events received between the signal node 2 and the power low supply network, the protection device 220 includes the first n-well 43a and the deep n-well 41, which are electrically floating. In particular, in the illustrated configuration, the fourth N+ region 45d in the first n-well 43a is electrically floating or unbiased. Electrically floating these regions permits the voltage of the first n-well 43a and the deep n-well 41 to be controlled to voltage levels above and below the voltage of the substrate supply node 5.

The protection device 220 further includes the second n-well 43b and the third and fourth p-wells 42c, 42d, which have been arranged as rings around the first n-well 43a. The second n-well 43b and the third and fourth p-wells 42c, 42d can operate as a guard well structure that can be used to electrically isolate the device from other structures fabricated in the p-type substrate 49. The guard well structure can aid in collecting carriers injected into the substrate 49 from the electrically floating n-type structure associated with the first n-well 43a and the deep n-well 41.

The protection device 220 of FIG. 7C has been annotated to show certain equivalent circuit devices formed from the illustrated structure, such as a first NPN bipolar transistor 51, a second NPN bipolar transistor 52, a first PNP bipolar transistor 61, a second PNP bipolar transistor 62, a first PMOS transistor 91, a second PMOS transistor 92, a first resistor 221, a second resistor 222, and a third resistor 223. The protection device 220 of FIG. 7C has also been illustrated to include a first resistor structure 80a and a second resistor structure 80b, which can be explicit resistors. Although the protection device 220 is illustrated as including the first and second resistor structures 80a, 80b, one or both of the resistor structures can be omitted.

The first resistor structure 80a can be used to provide additional resistance between the first p-well 42a and the first power low supply node 3a, which can aid in controlling the blocking voltage of the first SCR associated with the first NPN bipolar transistor 51 and the first PNP bipolar transistor 61. The second resistor structure 80b can be used to provide additional resistance between the second p-well 42b and the signal node 2, which can aid in controlling the blocking voltage of the second SCR associated with the second NPN bipolar transistor 52 and the second PNP bipolar transistor 62. The first and second resistor structures 80a, 80b can be implemented in any suitable manner, such as by using a resistive material having a geometry selected to achieve the desired resistance. In certain implementations, the first and/or second resistor structures 80a, 80b can be implemented using n-type and/or p-type poly resistor structures integrated within the device formation footprint. In one embodiment, the first resistor structure 80a has a resistance selected to be in the range of about 50Ω to about 5 kΩ. In one embodiment, the second resistor structure 80b has a resistance selected to be in the range of about 50Ω to about 5 kΩ.

The second NPN bipolar transistor 52 includes an emitter associated with the third N+ region 45c, a base associated with the second p-well 42b, and a collector associated with the central region of the first n-well 43a. The second PNP bipolar transistor 62 includes an emitter associated with the sixth P+ region 44f, a base associated with the central region of the first n-well 43a, and a collector associated with the second p-well 42b. The first NPN bipolar transistor 51 and the first PNP bipolar transistor 61 can be as described earlier with respect to FIGS. 3A-3C.

The first resistor 221 is associated with a resistance of the first p-well 42a between the second P+ region 44b and the base of the first NPN bipolar transistor 51. The second resistor 222 is associated with a resistance of the second p-well 42b between the third P+ region 44c and the base of the second NPN bipolar transistor 52. The third resistor 223 is associated with a resistance of the first n-well 43a and the deep n-well 41 between the base of the first PNP bipolar transistor 61 and the base of the second PNP bipolar transistor 62.

The first PMOS transistor 91 includes a source associated with the first P+ region 44a, a drain associated with the first p-well 42a, a gate associated with the first NMET gate region 46a, and a body associated with the left region of the first n-well 43a. Additionally, the second PMOS transistor 92 includes a source associated with the sixth P+ region 44f, a drain associated with the second p-well 42b, a gate associated with the second NMET gate region 46b, and a body associated with the central region of the first n-well 43a.

Figure 8:
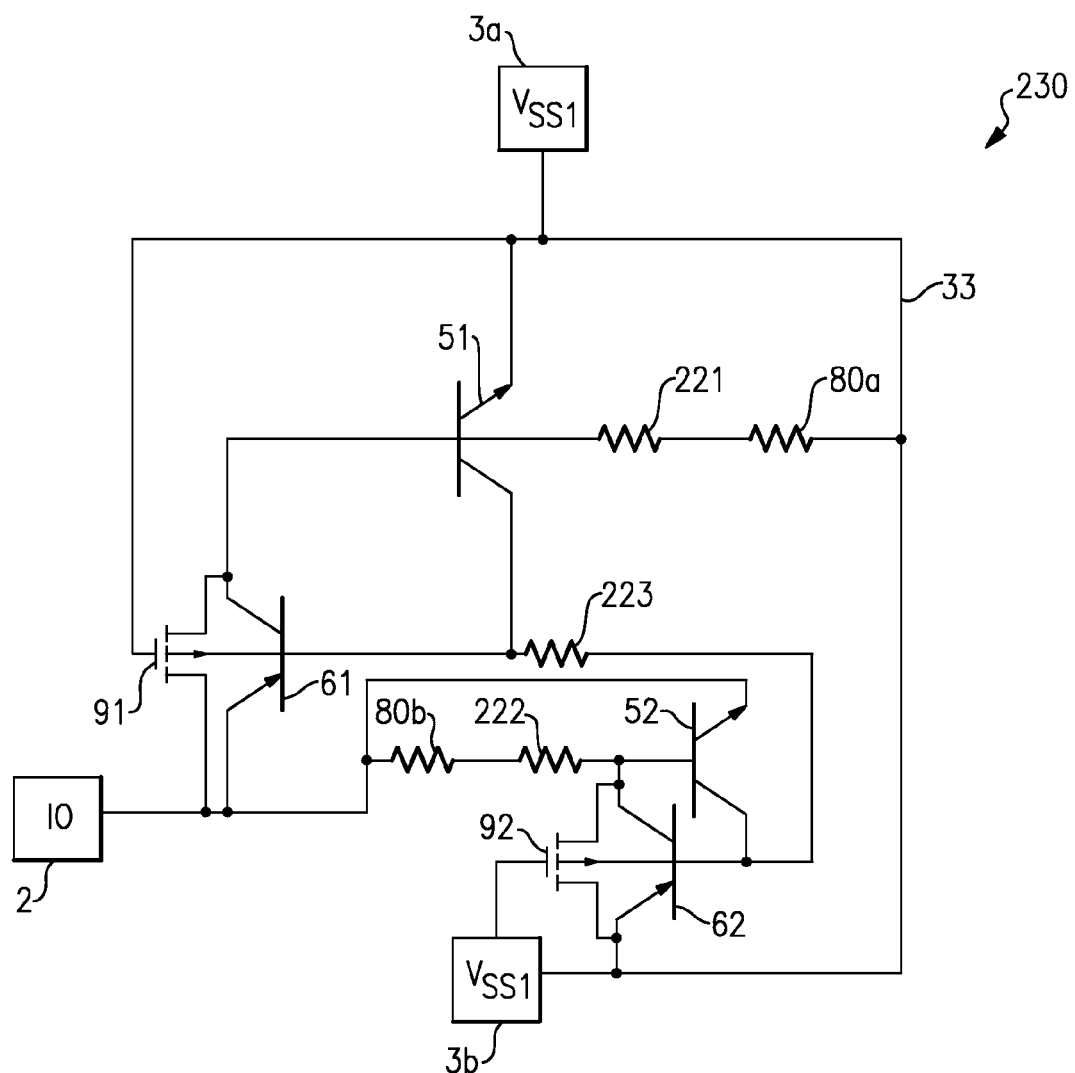
FIG. 8 is an equivalent circuit diagram of the protection device of FIGS. 7A-7C.

FIG. 8 is an equivalent circuit diagram 230 of the protection device 220 of FIGS. 7A-7C. The circuit diagram 230 includes the first NPN bipolar transistor 51, the second NPN bipolar transistor 52, the first PNP bipolar transistor 61, the second PNP bipolar transistor 62, the first PMOS transistor 91, the second PMOS transistor 92, and the resistors 80a-80b, 221-223, which can be as described earlier. The circuit diagram 230 illustrates various connections between the components and the signal node 2, the first power low supply node 3a, the second power low supply node 3b, the power high supply node 4, and the substrate supply node 5.

The circuit diagram 230 illustrates one implementation of the protection circuit 210 of FIG. 6. For example, the first NPN bipolar transistor 51 and the first PNP bipolar transistor 61 can operate as the first SCR 11, and the second NPN bipolar transistor 52 and the second PNP bipolar transistor 62 can operate as the second SCR 12.

During an ESD event that increases the voltage of the signal node 2 relative to the voltage of the first power low supply node 3a, the first PMOS transistor 91 can activate to provide enhanced protection and lower device on-state resistance of the protection device. Additionally, during an ESD event that increases the voltage of the second power low supply node 3b relative to the voltage of the signal node 2, second PMOS transistor 92 can activate to provide enhanced protection and lower device on-state resistance of the protection device. The gates of the first and second PMOS transistors 91, 92 have been implemented using NMET, which can operate to increase the threshold voltage of the PMOS transistors and to reduce leakage current relative to a configuration using PMET.

Figure 9:
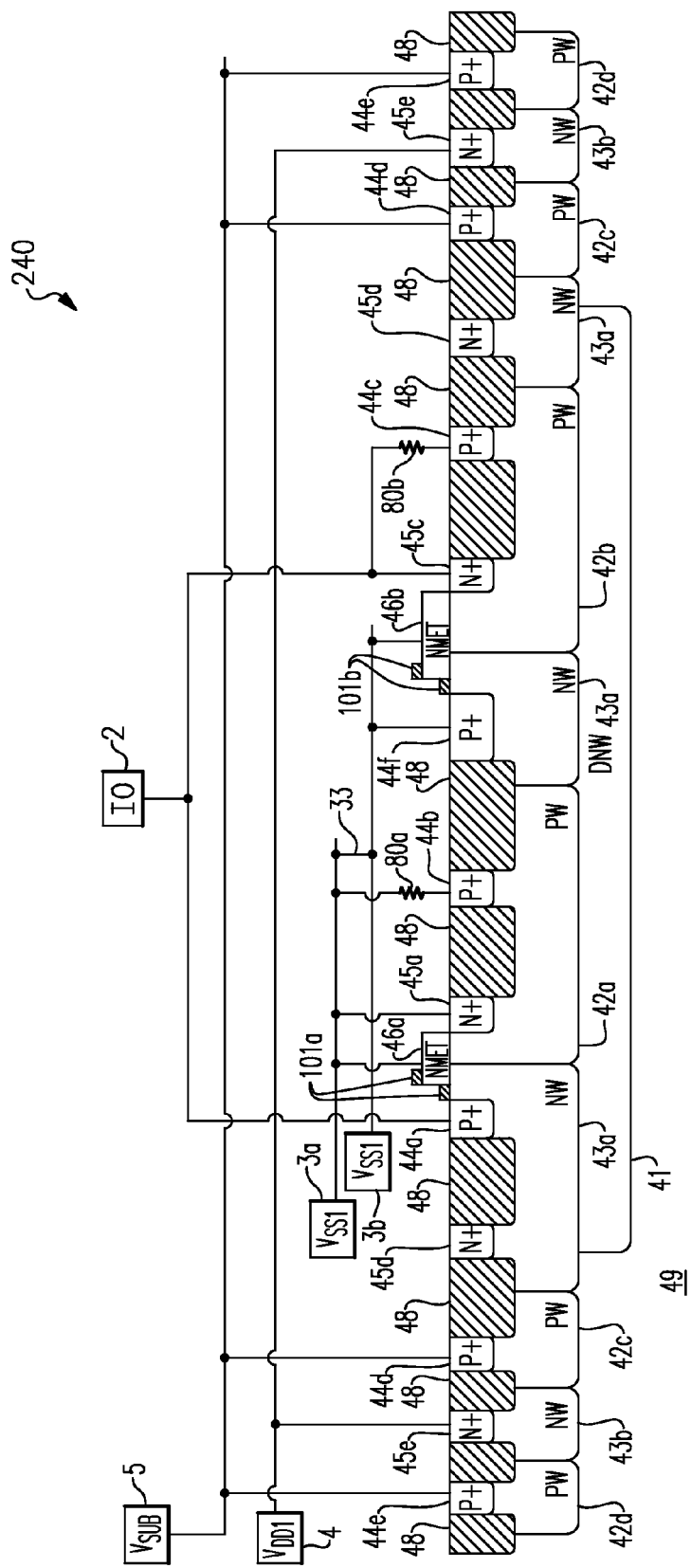
FIG. 9 is a cross section of a signal IO protection device referenced to a single power supply according to another embodiment.

FIG. 9 is a cross section of a protection device 240 according to another embodiment. The protection device 240 of FIG. 9 is similar to the protection device 220 of FIGS. 7A-7C, except that the protection device 240 of FIG. 9 further includes first and second RPO regions 101a, 101b.

In the illustrated configuration, the first RPO region 101a is disposed over a portion of the first NMET gate region 46a and over a surface of the left region of the first n-well 43a between the first NMET gate region 46a and the first P+ region 44a. Additionally, the second RPO region 101b is disposed over a portion of the second NMET gate region 46b and over a surface of the central region of the first n-well 43a between the second NMET gate region 46*b* and the sixth P+ region 44*f*. However, other RPO region configurations are possible.

The first and second RPO regions 101*a*, 101*b* can reduce standing leakage associated with MOS transistor formations relative to the configuration shown in FIGS. 7A-7C. However, including the RPO regions 101*a*, 101*b* can reduce turn-on speed of the protection device 240 relative to the configuration shown in FIGS. 7A-7C. Additional details of the first and second RPO regions 101*a*, 101*b* can be similar to those described earlier.

Figure 10:
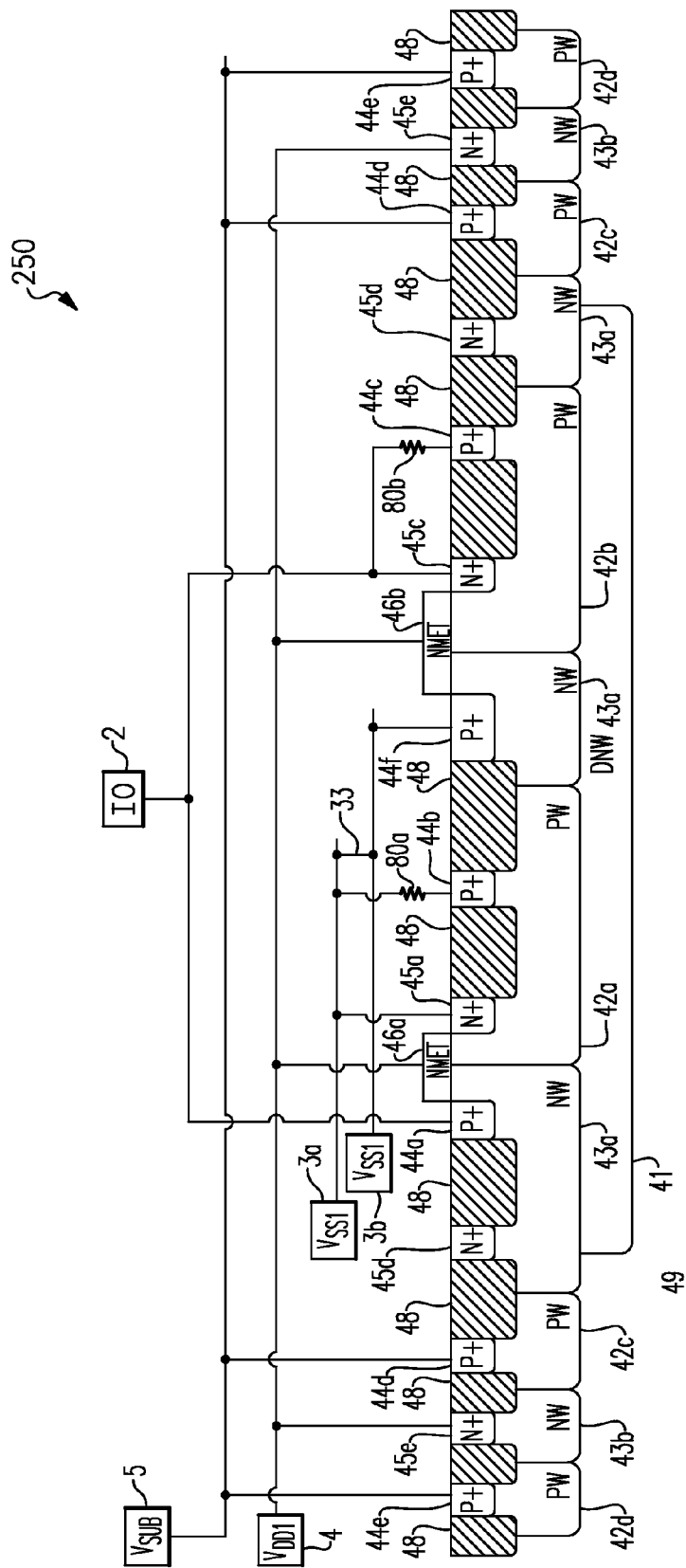
FIG. 10 is a cross section of a signal IO protection device referenced to a single power supply according to another embodiment.

FIG. 10 is a cross section of a signal IO protection device 250 referenced to a single power supply according to another embodiment. The protection device 250 includes the deep n-well 41, first to fourth p-wells 42*a*-42*d*, first and second n-wells 43*a*, 43*b*, first to sixth P+ regions 44*a*-44*f*, the first N+ region 45*a*, third to fifth N+ regions 45*c*-45*e*, first and second NMET gate regions 46*a*, 46*b*, and oxide regions 48. The protection device 250 is fabricated in the p-type substrate 49.

The protection device 250 of FIG. 10 is similar to the protection device 220 of FIGS. 7A-7C, except that the protection device 250 includes a different configuration of gate connectivity. For example, in the configuration shown in FIG. 10, the first and second NMET gate regions 46*a*, 46*b* are electrically connected to the power high supply node 4.

Configuring the protection device 250 in this manner can reduce leakage current of the PMOS transistors associated with the first and second NMET gate regions 46*a*, 46*b* (for example, the first and second PMOS transistors 91, 92 shown in FIG. 7C). The illustrated configuration can be used, for example, in applications having low standing current specifications between the signal node 2 and the power low supply. The illustrated configuration can be suitable for applications in which a voltage difference between the power high supply node 4 and a minimum or low value of the signal node 2 is less than a gate oxide reliability specification of the process used to fabricate the protection device.

Figure 11:
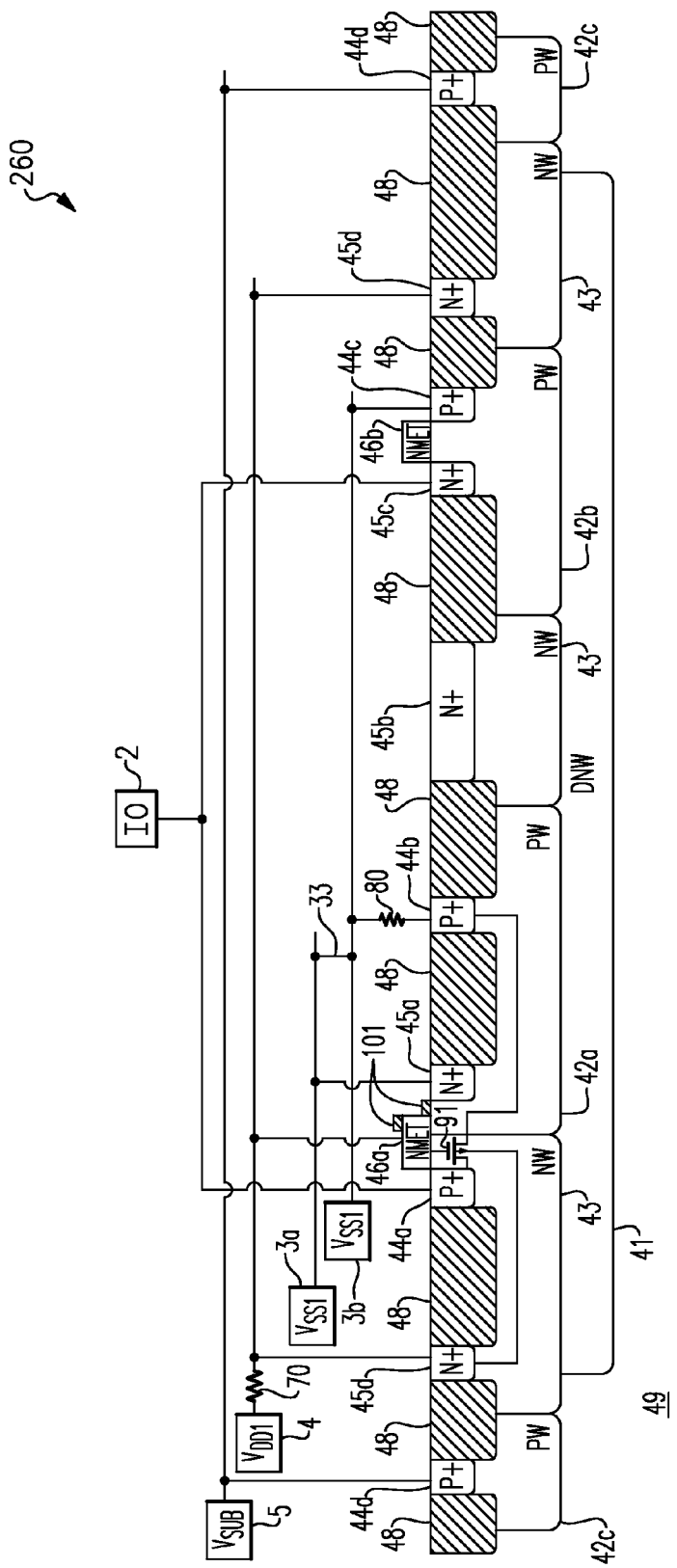
FIG. 11 is a cross section of a signal IO protection device referenced to a single power supply according to another embodiment.

FIG. 11 is a cross section of a signal IO protection device 260 referenced to a single power supply according to another embodiment. The protection device 260 includes the deep n-well 41, first to third p-wells 42*a*-42*c*, the n-well 43, first to fourth P+ regions 44*a*-44*d*, first to fourth N+ regions 45*a*-45*d*, first and second NMET gate regions 46*a*, 46*b*, oxide regions 48, and an RPO region 101. The illustrated protection device 260 is fabricated in the p-type substrate 49.

The protection device 260 of FIG. 11 is similar to the protection device 40 of FIGS. 3A-3C, except that the protection device 260 illustrates a different configuration of gate connectivity and a configuration that further includes the RPO region 101.

For example, in the configuration shown in FIG. 11, the first NMET gate region 46*a* is electrically connected to the power high supply node 4. Additionally, the RPO region 101 is disposed over a portion of the first NMET gate region 46*a* and over a surface of the first p-well 42*a* between the first NMET gate region 46*a* and the first N+ region 45*a*.

Electrically connecting the first NMET gate region 46*a* to the power high supply node 4 can aid in reducing the standing leakage of the first PMOS transistor 91 shown in FIG. 11. Additionally, including the RPO region 101 can be used to prevent formation of a parasitic NMOS transistor structure associated with the first NMET gate region 46*a*. For example, in a configuration in which the RPO region 101 is omitted and the first NMET gate region 46*a* extends to an edge of the first N+ region 45*a*, leakage current may be generated by a parasitic NMOS transistor having a source, drain, and gate associated with the first N+ region 45*a*, the left region of the n-well 43, and the first NMET gate region 46*a*, respectively.

Accordingly, inclusion of the RPO region 101 can prevent formation of such a parasitic NMOS transistor structure, thereby reducing the protection device's leakage current.

Figure 12:
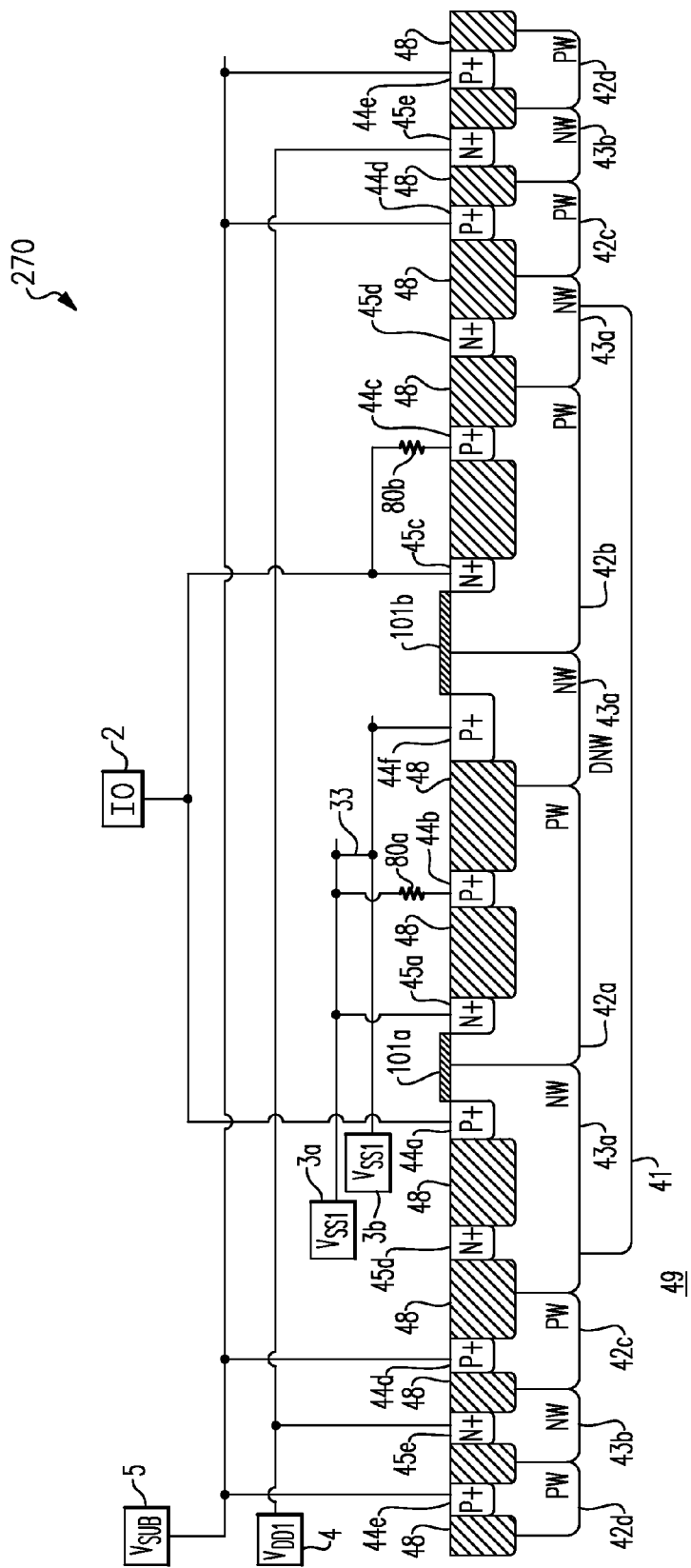
FIG. 12 is a cross section of a signal IO protection device referenced to a single power supply according to another embodiment.

FIG. 12 is a cross section of a signal IO protection device 270 referenced to a single power supply according to another embodiment. The protection device 270 includes the deep n-well 41, first to fourth p-wells 42*a*-42*d*, first and second n-wells 43*a*, 43*b*, first to sixth P+ regions 44*a*-44*f*, the first N+ region 45*a*, third to fifth N+ regions 45*c*-45*e*, oxide regions 48, and first and second RPO regions 101*a*, 101*b*. The protection device 270 is fabricated in the p-type substrate 49.

The protection device 270 of FIG. 12 is similar to the protection device 220 of FIGS. 7A-7C, except that the protection device 270 illustrates a configuration in which the first and second NMET gate regions 46*a*, 46*b* of FIGS. 7A-7C have been omitted in favor of using the first and second RPO regions 101*a*, 101*b*. For example, the first RPO region 101*a* is positioned over a boundary between the first p-well 42*a* and the left region of the n-well 43, and extends between the first P+ region 44*a* and the first N+ region 45*a*. Additionally, the second RPO region 101*b* is positioned over a boundary between the second p-well 42*b* and the central region of the first n-well 43*a*, and extends between the sixth P+ region 44*f* and the third N+ region 45*c*.

Configuring the protection device 270 in this manner can reduce the protection device's leakage current by preventing formation of the first and second PMOS transistors 91, 92 shown in FIG. 7C. Thus, the illustrated configuration can be used, for example, in applications having low standing current specifications between the signal node 2 and the power low supply. However, the protection device 270 can also have a slower turn-on speed relative to the protection device 220 of FIGS. 7A-7C.

Figure 13:
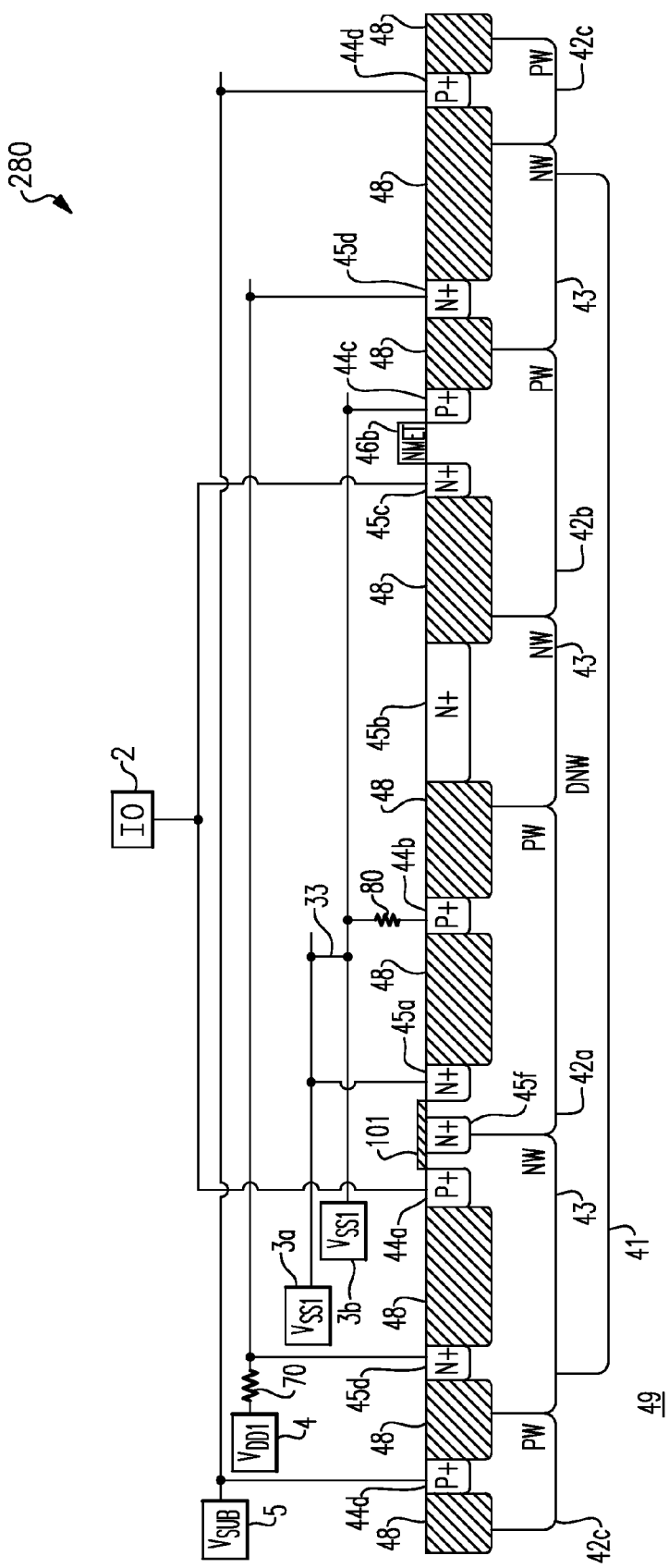
FIG. 13 is a cross section of a signal IO protection device referenced to a single power supply according to another embodiment.

FIG. 13 is a cross section of a signal IO protection device 280 referenced to a single power supply according to another embodiment. The protection device 280 includes the deep n-well 41, first to third p-wells 42*a*-42*c*, the n-well 43, first to fourth P+ regions 44*a*-44*d*, first to fourth N+ regions 45*a*-45*d*, a sixth N+ region 45*f*, the second NMET gate region 46*b*, oxide regions 48, and an RPO region 101. The illustrated protection device 280 is fabricated in the p-type substrate 49.

The protection device 280 of FIG. 13 is similar to the protection device 40 of FIGS. 3A-3C, except that the protection device 280 illustrates a configuration in which the first NMET gate region 46*a* of FIGS. 3A-3C has been omitted in favor of using the RPO region 101, and in which the sixth N+ region 45*f* has been included. For example, the RPO region 101 is positioned over a boundary between the first p-well 42*a* and the left region of the n-well 43, and extends between the first P+ region 44*a* and the first N+ region 45*a*. Additionally, the sixth N+ region 45*f* is positioned beneath the RPO region 101 along the boundary between the first p-well 42*a* and the left region of the n-well 43.

Configuring the protection device 280 in this manner can reduce the protection device's leakage current by preventing formation of the first PMOS transistor 91 shown in FIG. 3C. Additionally, including sixth N+ region 45*f* aids in providing a higher blocking voltage and higher trigger voltage between the signal node 2 and the first power low supply node 3*a*. For example, the sixth N+ region 45*f* increases the trigger voltage of the PNPN SCR associated with first P+ region 44*a*, the left region of the n-well 43, the first p-well 42*a*, and the first N+ region 45*a*.

Figure 14:
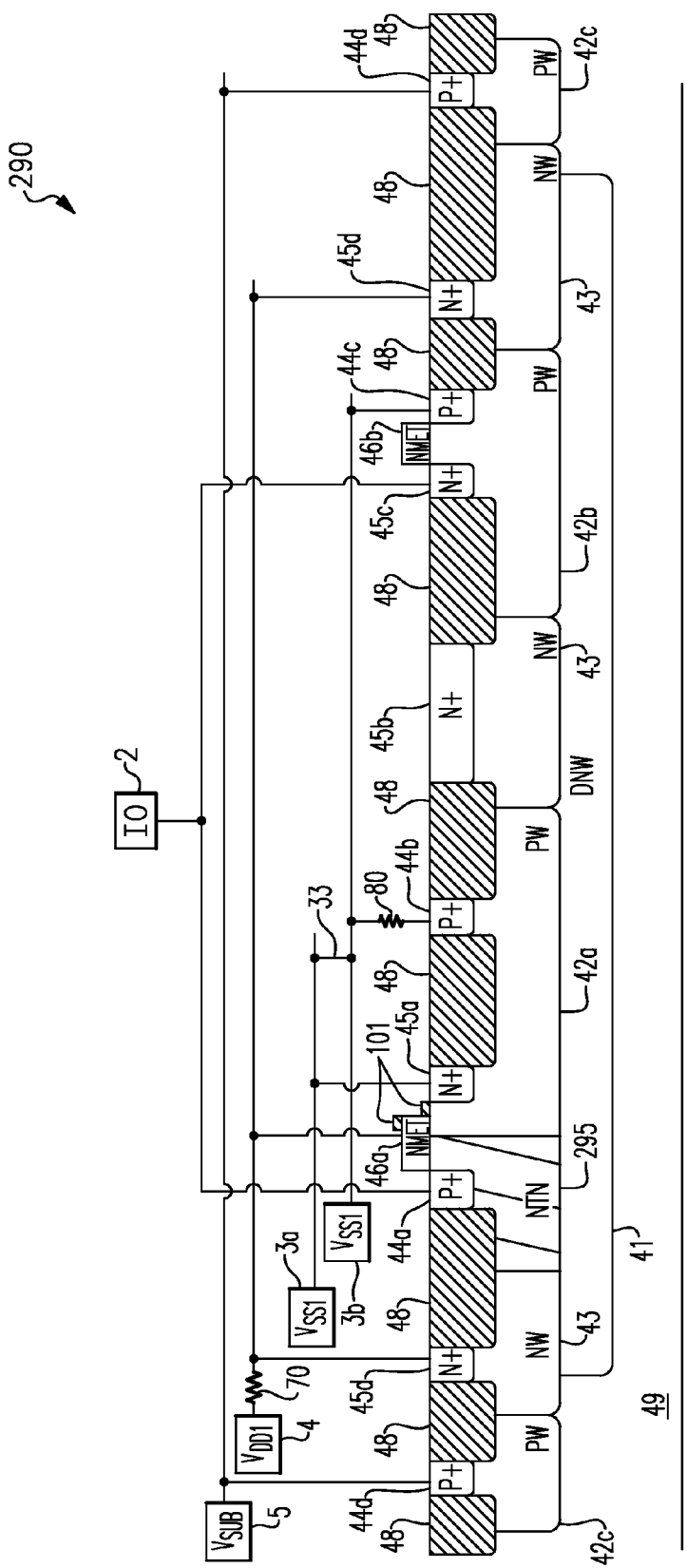
FIG. 14 is a cross section of a signal IO protection device referenced to a single power supply according to another embodiment.

FIG. 14 is a cross section of a signal IO protection device 290 referenced to a single power supply according to another embodiment. The protection device 290 includes the deep n-well 41, first to third p-wells 42*a*-42*c*, the n-well 43, first to fourth P+ regions 44a-44d, first to fourth N+ regions 45a-45d, first and second NMET gate regions 46a, 46b, oxide regions 48, the RPO region 101, and an n-type native region 295. The illustrated protection device 260 is fabricated in the p-type substrate 49.

The protection device 290 of FIG. 14 is similar to the protection device 260 of FIG. 11, except that the protection device 290 includes the n-type native region 295.

In certain fabrication processes, a native or NTN implant blocking region can be used to block well implants during fabrication. For example, in one embodiment, the NTN implant blocking region can be used to block implants associated with doping n-wells and p-wells, such as the n-well 43 and the first to third p-wells 42a-42c. Use of the NTN implant blocking region can result in the formation of native regions, which have a doping corresponding to a background doping concentration. For example, in the illustrated configuration, the n-type native region 295 can have an n-type doping corresponding to a background doping concentration or profile associated with formation of the deep n-well 41. After formation of native regions, the NTN implant blocking region can be removed and may not be present after the protection device is fabricated.

As shown in FIG. 14, the first P+ region 44a is disposed in the n-type native region 295. Additionally, the first NMET gate region 46a is positioned over a boundary between the n-type native region 295 and the first p-well 42a, and extends from the first P+ region 44a toward the first N+ region 45a.

Including the n-type native region 295 in the protection device 290 can reduce a parasitic capacitance of the device relative to a configuration using wells rather than native regions. Additional details of the protection device 290 can be similar to those described earlier.

Figure 15:
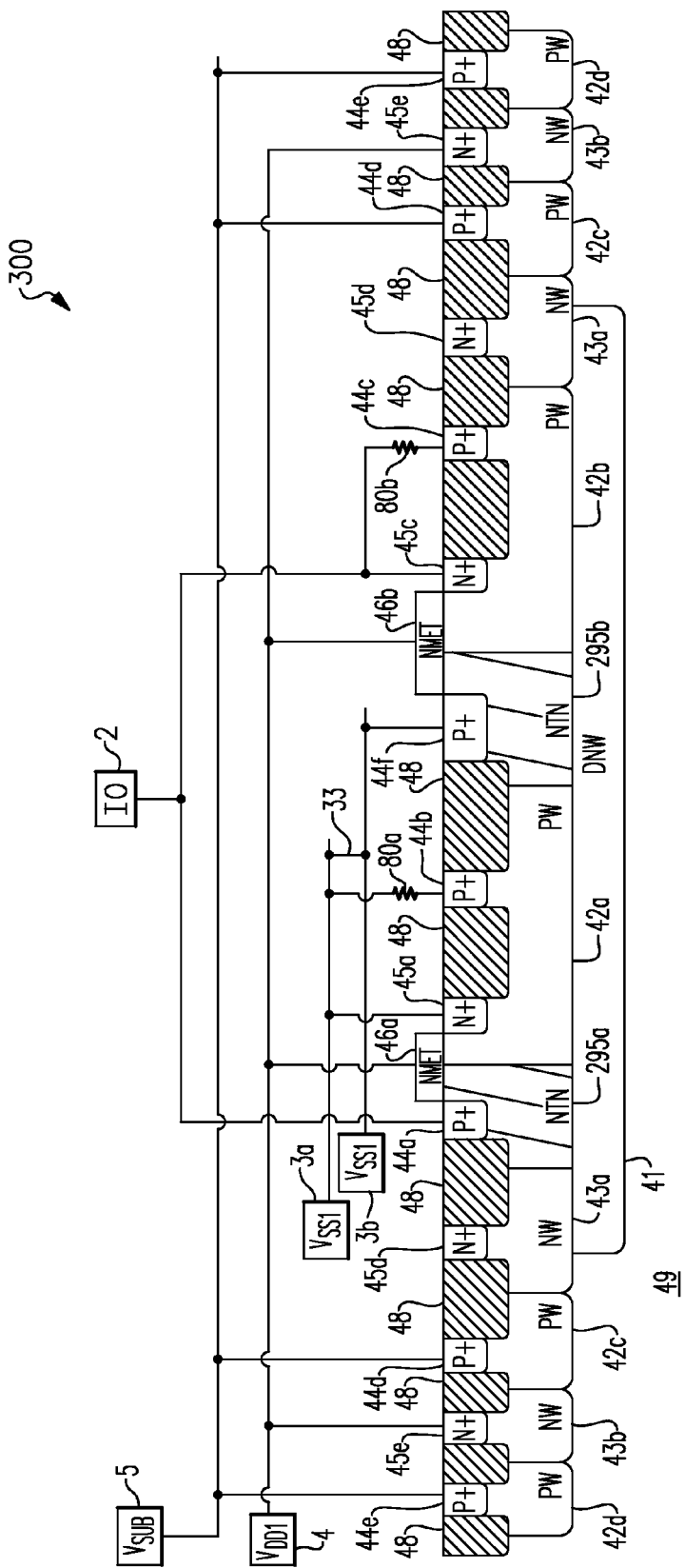
FIG. 15 is a cross section of a signal IO protection device referenced to a single power supply according to another embodiment.

FIG. 15 is a cross section of a signal IO protection device 300 referenced to a single power supply according to another embodiment. The protection device 300 includes the deep n-well 41, first to fourth p-wells 42a-42d, first and second n-wells 43a, 43b, first to sixth P+ regions 44a-44f, the first N+ region 45a, the third to fifth N+ regions 45c-45e, first and second NMET gate regions 46a, 46b, oxide regions 48 and first and second n-type native regions 295a, 295b. The protection device 300 is fabricated in the p-type substrate 49.

The protection device 300 of FIG. 15 is similar to the protection device 250 of FIG. 10, except that the protection device 300 further includes the first and second n-type native regions 295a, 295b.

As described earlier, in certain fabrication processes, an NTN implant blocking region can be used to block well implants during fabrication. The NTN implant blocking region can be used to block implants associated with doping n-wells and p-wells, such as the first and second n-wells 43a, 43b and the first to fourth p-wells 42a-42d. Use of the NTN implant blocking region can result in the formation of native regions, which have a doping corresponding to a background doping concentration. For example, in the illustrated configuration, the first and second n-type native regions 295a, 295b can have an n-type doping corresponding to a background doping concentration or profile associated with doping the deep n-well 41. After formation of native regions, the NTN implant blocking region can be removed and may not be present after the protection device is fabricated.

As shown in FIG. 15, the first P+ region 44a is disposed in the first n-type native region 295a. Additionally, the first NMET gate region 46a is positioned over a boundary between the first n-type native region 295a and the first p-well 42a, and extends between the first P+ region 44a and the first N+ region 45a. Furthermore, the sixth P+ region 44f is disposed in the second n-type native region 295b. Additionally, the second NMET gate region 46b is positioned over a boundary between the second n-type native region 295b and the second p-well 42b, and extends between the sixth P+ region 44f and the third N+ region 45c.

Including the first and second n-type native regions 295a, 295b in the protection device 300 can reduce a parasitic capacitance of the device relative to a configuration using wells rather than native regions. Additional details of the protection device 300 can be similar to those described earlier.

Figure 16:
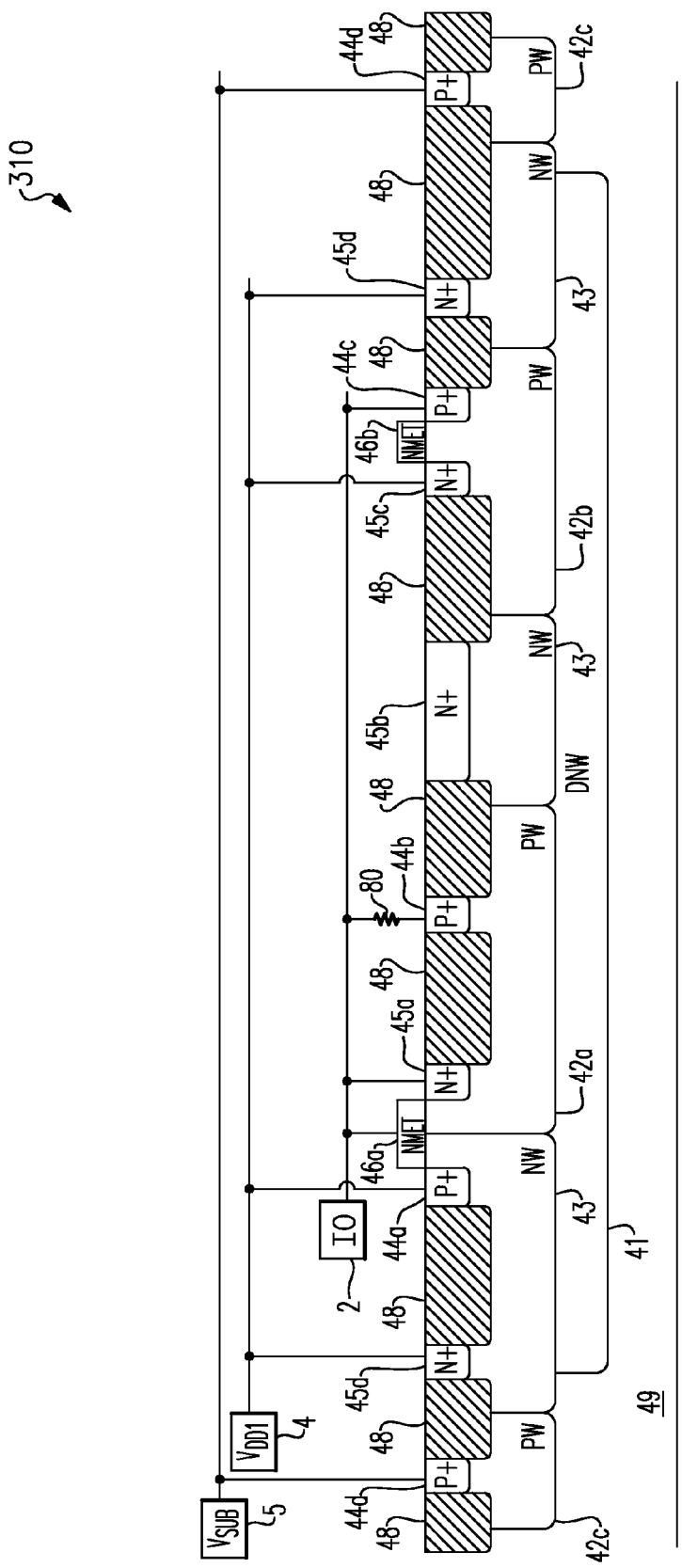
FIG. 16 is a cross section of a signal IO protection device referenced to a single power supply according to another embodiment.

FIG. 16 is a cross section of a signal IO protection device 310 referenced to a single power supply according to another embodiment. The protection device 310 includes the deep n-well 41, first to third p-wells 42a-42c, the n-well 43, first to fourth P+ regions 44a-44d, first to fourth N+ regions 45a-45d, first and second NMET gate regions 46a, 46b, and oxide regions 48. The illustrated protection device 310 is fabricated in the p-type substrate 49.

The protection device 310 of FIG. 16 is similar to the protection device 40 of FIGS. 3A-3C, except that the protection device 310 illustrates a configuration in which the protection device includes different terminal connectivity. For example, in the illustrated configuration, the protection device 310 provides protection between the power high supply node 4 and the signal node 2. As shown in FIG. 16, the first P+ region 44a and the third N+ region 45c are electrically connected to the power high supply node 4, and the first NMET gate region 46a, the first N+ region 45a, and the second and third P+ regions 44b, 44c are electrically connected to the signal node 2.

In contrast to the protection device 40 of FIGS. 3A-3C which is suitable for providing protection to circuitry referenced to a power low supply, the illustrated protection device 310 is suitable for providing protection to circuitry reference to a power high supply. For example, in one embodiment, the protection device 310 provides protection to PMOS transistors associated with a DAC output. However, other configurations are possible. Additional details of the protection device 310 can be similar to those described earlier.

Figure 17:
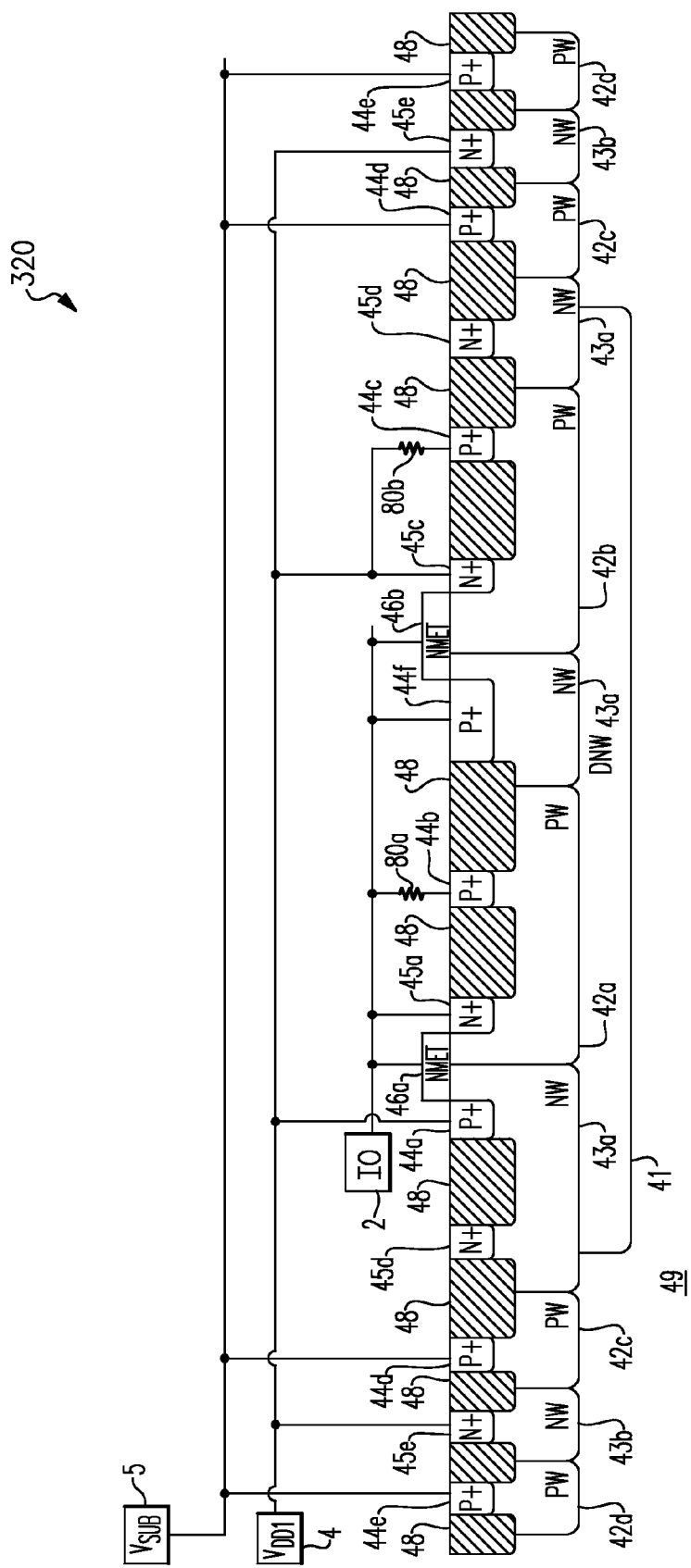
FIG. 17 is a cross section of a signal IO protection device referenced to a single power supply according to another embodiment.

FIG. 17 is a cross section of a signal IO protection device 320 referenced to a single power supply according to another embodiment. The protection device 320 includes the deep n-well 41, first to fourth p-wells 42a-42d, first and second n-wells 43a, 43b, first to sixth P+ regions 44a-44f, the first N+ region 45a, third to fifth N+ regions 45c-45e, first and second NMET gate regions 46a, 46b, and oxide regions 48. The protection device 320 is fabricated in the p-type substrate 49.

The protection device 320 of FIG. 17 is similar to the protection device 220 of FIGS. 7A-7C, except that the protection device 320 includes a different configuration of terminal connectivity. For example, in the illustrated configuration, the protection device 320 provides protection between the power high supply node 4 and the signal node 2. As shown in FIG. 17, the first P+ region 44a, the third N+ region 45c, and the third P+ region 44c are electrically connected to the power high supply node 4, and the first and second NMET gate regions 46a, 46b, the first N+ region 45a, the second P+ region 44b, and the sixth P+ region 44f are electrically connected to the signal node 2.

The illustrated protection device 320 is suitable for providing protection to circuitry reference to a power high supply. Additional details of the protection device 320 can be similar to those described earlier.

Although certain protection devices herein are illustrated in the context of being electrically connected between a signal node and a power low supply network, the teachings herein are applicable to configurations in which the protection device is electrically connected between a power high supply network and a signal node. For example, the protection devices of FIGS. 5 and 9-15 can be modified to be referenced to a power high supply network in a manner similar to that described with reference to FIGS. 16 and 17.

Applications

Devices employing the above described protection schemes can be implemented into various data conversion and/or signal processing electronic devices and interface applications. Examples of the electronic devices can include, but are not limited to, consumer electronic products, parts of the consumer electronic products, electronic test equipment as well as high robustness industrial and automotive applications, among other applications in the semiconductor industry. Examples of the electronic devices can also include circuits of optical networks or other communication networks and circuits for voltage reference and electrical cars battery power management. The electronic products can include, power management integrated circuits for cell phones, base stations, a vehicle engine management controller, a transmission controller, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatuscomprising:
   a substrate;
   a first n-type semiconductor region in the substrate;
   a first p-type semiconductor region in the substrate;
   a second n-type semiconductor region in the substrate, wherein the first p-type semiconductor region is positioned between the first and second n-type semiconductor regions;
   a second p-type semiconductor region in the substrate, wherein the second n-type semiconductor region is positioned between the first and second p-type semiconductor regions;
   a first p-type diffusion region in the first n-type semiconductor region;
   a first n-type diffusion region in the first p-type semiconductor region, wherein the first n-type diffusion region is electrically connected to a first node;
   a second n-type diffusion region in the second p-type semiconductor region, wherein the first p-type diffusion region and the second n-type diffusion region are electrically connected to a second node;
   a deep n-type region positioned beneath at least a portion of the first n-type semiconductor region, the first p-type semiconductor region, the second n-type semiconductor region, and the second p-type semiconductor region; and
   at least one of a gate region or a resist protective oxide (RPO) region positioned between the first p-type diffusion region and the first n-type diffusion region,
   wherein the first p-type diffusion region, the first n-type semiconductor region, the first p-type semiconductor region, and the first n-type diffusion region are configured to operate as a first silicon controlled rectifier (SCR) in a first electrical path between the second node and the first node.

2. The apparatus of claim 1, further comprising:
   a second p-type diffusion region in the first p-type semiconductor region;
   a third p-type diffusion region in the second p-type semiconductor region; and
   a third n-type semiconductor region in the substrate, wherein the second p-type semiconductor region is positioned between the second and third n-type semiconductor regions, wherein the deep n-type region is further positioned beneath at least a portion of the third n-type semiconductor region.

3. The apparatus of claim 2, wherein the first node comprises a power low supply network, and wherein the second node comprises a signal node.

4. The apparatus of claim 3, wherein the third p-type diffusion region is electrically connected to the power low supply network, wherein the second n-type diffusion region and the second p-type semiconductor region are configured to operate as a diode in a second electrical path between the power low supply network and the signal node.

5. The apparatus of claim 4, wherein the power low supply network comprises a first power low supply node and a second power low supply node, wherein the first SCR includes an anode electrically connected to the signal node and a cathode electrically connected to the first power low supply node, and wherein the diode includes an anode electrically connected to the second power low supply node and a cathode electrically connected to the signal node.

6. The apparatus of claim 4, wherein the at least one of the gate region or the RPO region comprises a first gate region, wherein the first gate region includes a first portion adjacent the first n-type semiconductor region and a second portion adjacent the first p-type semiconductor region.

7. The apparatus of claim 6, further comprising a second gate regionover the second p-type semiconductor region, wherein the second gate region is positioned between the second n-type diffusion region and the third p-type diffusion region.

8. The apparatus of claim 7, wherein the first gate region is electrically connected to the power low supply network, and wherein the second gate region is electrically floating.

9. The apparatus of claim 8, wherein the at least one of the gate region or the RPO region further comprises a first RPO region, wherein the first RPO region includes a first portion over the first n-type semiconductor region and a second portion over the first gate region.

10. The apparatus of claim 7, wherein the first gate region is electrically connected to a power high supply node, and wherein the second gate region is electrically floating.

11. The apparatus of claim 10, wherein the at least one of the gate region or the RPO region further comprises a first RPO region, wherein the first RPO region includes a first portion over the first p-type semiconductor region and a second portion over the first gate region.

12. The apparatus of claim 4, wherein the at least one of the gate region or the RPO region comprises a first RPO region, wherein the first RPO region includes a first portion adjacent the first n-type semiconductor region and a second portion adjacent the first p-type semiconductor region.

13. The apparatus of claim 12, further comprising:
a fourth n-type diffusion region along the boundary between the first n-type semiconductor region and the first p-type semiconductor region; and
a first gate region adjacent the second p-type semiconductor region, wherein the first gate region is positioned between the second n-type diffusion region and the third p-type diffusion region, and wherein the first gate region comprises metal associated with a gate of an n-type metal oxide semiconductor transistor.

14. The apparatus of claim 4, wherein the first n-type semiconductor region comprises a first n-type well region, wherein the second n-type semiconductor region comprises a second n-type well region, wherein the third n-type semiconductor region comprises a third n-type well region, wherein the first p-type semiconductor region comprises a first p-type well region, and wherein the second p-type semiconductor region comprises a second p-type well region.

15. The apparatus of claim 4, wherein the first n-type semiconductor region comprises a first n-type native region, wherein the second n-type semiconductor region comprises a first n-type well region, wherein the third n-type semiconductor region comprises a second n-type well region, wherein the first p-type semiconductor region comprises a first p-type well region, and wherein the second p-type semiconductor region comprises a second p-type well region.

16. The apparatus of claim 4, further comprising an explicit resistor, wherein the second p-type diffusion region is electrically connected to the power low supply network through the explicit resistor.

17. The apparatus of claim 3, further comprising a fourth p-type diffusion region in the second n-type semiconductor region, wherein the fourth p-type diffusion region is electrically connected to the power low supply network, wherein the fourth p-type diffusion region, the second n-type semiconductor region, the second p-type semiconductor region, and the second n-type diffusion region are configured to operate as a second SCR in a second electrical path between the power low supply network and the signal node.

18. The apparatus of claim 17, wherein the power low supply network comprises a first power low supply node and a second power low supply node, wherein the first SCR includes an anode electrically connected to the signal node and a cathode electrically connected to the first power low supply node, and wherein the second SCR includes an anode electrically connected to the second power low supply node and a cathode electrically connected to the signal node.

19. The apparatus of claim 17, further comprising a third n-type diffusion region in third n-type semiconductor region, wherein the third n-type diffusion region is electrically floating.

20. The apparatus of claim 17, wherein the at least one of the gate region or the RPO region comprises a first gate region, wherein the first gate region includes a first portion adjacent the first n-type semiconductor region and a second portion adjacent the first p-type semiconductor region.

21. The apparatus of claim 20, further comprising a second gate region positioned between the fourth p-type diffusion region and the second n-type diffusion region, wherein the second gate region includes a first portion adjacent the second n-type semiconductor region and a second portion adjacent the second p-type semiconductor region.

22. The apparatus of claim 21, wherein the first and second gate regions are electrically connected to the power low supply network.

23. The apparatus of claim 22, wherein the at least one of the gate region or the RPO region further comprises a first RPO region, wherein the first RPO region includes a first portion over the first n-type semiconductor region and a second portion over the first gate region, and wherein the apparatus further comprises as second RPO region, wherein the second RPO region includes a first portion over the second n-type semiconductor region and a second portion over the second gate region.

24. The apparatus of claim 21, wherein the first and second gate regions are electrically connected to a power high supply node.

25. The apparatus of claim 17, wherein the at least one of the gate region or the RPO region comprises a first RPO region, wherein the first RPO region includes a first portion adjacent the first n-type semiconductor region and a second portion adjacent the first p-type semiconductor region.

26. The apparatus of claim 25, further comprising a second RPO region positioned between the fourth p-type diffusion region and the second n-type diffusion region, wherein the second RPO region includes a first portion adjacent the second n-type semiconductor region and a second portion adjacent the second p-type semiconductor region.

27. The apparatus of claim 17, wherein the first n-type semiconductor region comprises a first n-type well region, wherein the second n-type semiconductor region comprises a second n-type well region, wherein the third n-type semiconductor region comprises a third n-type well region, wherein the first p-type semiconductor region comprises a first p-type well region, and wherein the second p-type semiconductor region comprises a second p-type well region.

28. The apparatus of claim 17, further comprising a first explicit resistor and a second explicit resistor, wherein the second p-type diffusion region is electrically connected to the power low supply network through the first explicit resistor, and wherein the third p-type diffusion region is electrically connected to the signal node through the second explicit resistor.

29. The apparatus of claim 2, wherein the first node comprises a signal node, and wherein the second node comprises a power high supply network.

* * * * *

UNITED STATES PATENT AND TRADEMARK OFFICE
CERTIFICATE OF CORRECTION

| | |
|---|---|
| PATENT NO. | : 9,123,540 B2 |
| APPLICATION NO. | : 14/068566 |
| DATED | : September 1, 2015 |
| INVENTOR(S) | : Salcedo et al. |

It is certified that error appears in the above-identified patent and that said Letters Patent is hereby corrected as shown below:

In the Specification

In column 1 at line 24, Change "2014,the" to --2014, the--.

In the Claims

In column 23 at line 51, In Claim 1, change --apparatuscomprising:-- to --apparatus comprising:--.

In column 24 at line 53, In Claim 7, change --regionover-- to --region over--.

In column 25 at line 50, In Claim 17, change --SCRin-- to --SCR in--.

Signed and Sealed this
Third Day of May, 2016

Michelle K. Lee
*Director of the United States Patent and Trademark Office*